United States Patent
Rifaat et al.

(10) Patent No.: US 6,912,683 B2
(45) Date of Patent: Jun. 28, 2005

(54) METHOD, APPARATUS, AND PRODUCT FOR USE IN GENERATING CRC AND OTHER REMAINDER BASED CODES

(75) Inventors: Rasekh Rifaat, Brookline, MA (US); Boris Lerner, Sharon, MA (US)

(73) Assignee: Analog Devices, Inc., Norwood, MA (US)

( * ) Notice: Subject to any disclaimer, the term of this patent is extended or adjusted under 35 U.S.C. 154(b) by 556 days.

(21) Appl. No.: 09/788,859

(22) Filed: Feb. 20, 2001

(65) Prior Publication Data

US 2003/0061561 A1 Mar. 27, 2003

Related U.S. Application Data

(60) Provisional application No. 60/183,197, filed on Feb. 17, 2000.

(51) Int. Cl.[7] ............................................. H03M 13/00
(52) U.S. Cl. ....................... 714/774; 714/757; 714/758
(58) Field of Search .................................. 714/774, 807, 714/715, 757, 758; 708/492; 375/298

(56) References Cited

U.S. PATENT DOCUMENTS

| | | | |
|---|---|---|---|
| 4,390,989 A | * | 6/1983 | Pehrson ...................... 714/715 |
| 5,016,208 A | | 5/1991 | Horst et al. |
| 5,251,236 A | * | 10/1993 | Brehmer et al. ............ 375/298 |
| 5,506,800 A | | 4/1996 | Dao-Trong |
| 5,742,533 A | | 4/1998 | Moncsko |
| 5,778,013 A | * | 7/1998 | Jedwab ........................ 714/807 |
| 5,951,707 A | | 9/1999 | Christensen et al. |
| 5,953,240 A | | 9/1999 | Prabhu et al. |
| 5,971,607 A | | 10/1999 | Im |
| 5,983,388 A | | 11/1999 | Friedman et al. |
| 5,987,484 A | | 11/1999 | Sherry et al. |
| 6,004,028 A | | 12/1999 | Bottomley |
| 6,029,186 A | * | 2/2000 | DesJardins et al. ......... 708/492 |
| 6,084,888 A | | 7/2000 | Watanabe et al. |
| 6,167,550 A | | 12/2000 | Gray |

FOREIGN PATENT DOCUMENTS

| | | |
|---|---|---|
| EP | 1087534 A | 3/2001 |
| WO | WO 9937030 A | 7/1999 |

OTHER PUBLICATIONS

Shu Lin, Daniel J. Costello, Jr., "Error Control Coding, Fundamentals and Applications", Prentice–Hall, Inc. Englewood Cliffs, New Jersey, 1983, pp. 85–124.

Roginsky A L, et al, "Efficient Computation of Packet CRC from partial CRCs with Application to the Cells–In– Frames Protocol" Computer Communications, Elsevier Science Publishers BV, Amsterdam, NL, vol. 21, No. 7, Jun. 15, 1998, pp. 654–661.

(Continued)

*Primary Examiner*—Albert Decady
*Assistant Examiner*—Dipakkumar Gandhi
(74) *Attorney, Agent, or Firm*—Wolf, Greenfield & Sacks, P.C.

(57) ABSTRACT

A method, apparatus and product for use in generating a remainder based code generates a plurality of preliminary remainder based codes in response to specified data, and synthesizing a remainder based code for the specified data, in response to the plurality of preliminary remainder based codes. In one embodiment, the plurality of preliminary remainder based codes includes at least two preliminary remainder based codes each generated in response to a respective portion of the specified data. In another embodiment, at least two preliminary remainder based codes are generated at least partially concurrently with one another.

84 Claims, 17 Drawing Sheets

OTHER PUBLICATIONS

Andrew S. Tanenbaum, Computer Networks, Prentice Hall, Inc., Englewood Cliffs, N.J., 1981, pp. 129–133.

Patrick Geremia, Cyclic Redundancy Check Computation: An Implementation Using the TMS320C54X, Texas Instruments Application Report SPRA530, Digital Signal Processing Solutions, Apr. 1999, pp. 1–35.

Ross N. Williams, A Painless Guide to CRC Error Detection Algorithms, Everything you wanted to know about CRC algorithms, but were afraid to ask for fear that errors in your understanding might be detected, ftp://ftp.rocksoft.com/clients/rocksoft/papers/crc_v3.txt, pp. 1–32.

Terry Ritter, The Great CRC Mystery, http://www.io.com/~ritter/ARTS/CRCMYST.HTM, pp. 1–10.

R.J. Glaise, A Two–Step Computation of Cyclic Redundancy Code CRC–32 for ATM Networks, IBM, http://www.research.ibm.com/journal/rd/416/glaise.txt, pp. 1–5.

Seong Leong Ng and Bill Dewar, Parallel Realization of the ATM Cell Header CRC, Computer Communications 19 (1996) pp. 257–263.

Cyclic Redundancy Checks, http://www.seanet.com/~ksbrown/kmath458.htm, pp. 1–7.

Ross Williams, Program for Writing CRC Lookup Table, http://www.repairfaq.org/filipg/LINK/crctable.c, pp. 1–3.

Terry Ritter, The Great CRC Mystery: Listing One, http://www.io.com/~ritter/ARTS/CRCLIST1.HTM.

Terry Ritter, The Great CRC Mystery: Listing Two, http://www.io.com/~ritter/ARTS/CRCLIST2.HTM.

Ross Williams, Header File for the reference implementation of the Rocksoft ™ Model CRC Algorithm, http://www.repairfaq.org/filipq/LINK/crcmodel.h, pp. 1–3.

Ross Williams, Implementation File for the reference implementation of the Rocksoft ™ Model CRC Algorithm, http://www.repairfaq.org/filipq/LINK/crcmodel.c, pp. 1–3.

* cited by examiner

Multiplication
54 { 
0 · 0 = 0
0 · 1 = 0
1 · 0 = 0
1 · 1 = 1
Addition
50 {
0 + 0 = 0
0 + 1 = 1
1 + 0 = 1
1 + 1 = 0
Subtraction
52 {
0 − 0 = 0
0 − 1 = 1
1 − 0 = 1
1 − 1 = 0
Fig. 2B
Prior Art
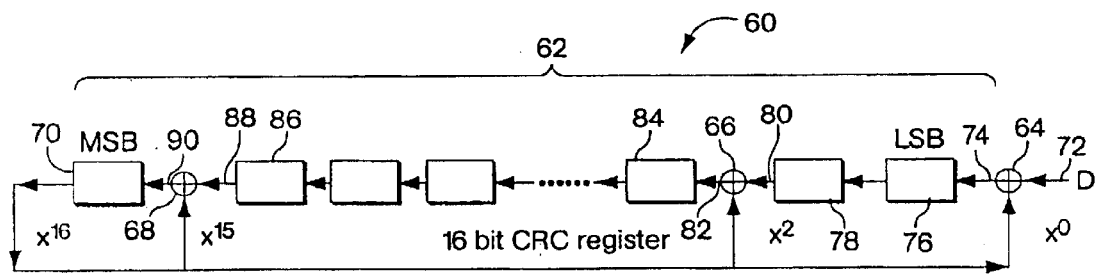
Fig. 2C
Prior Art
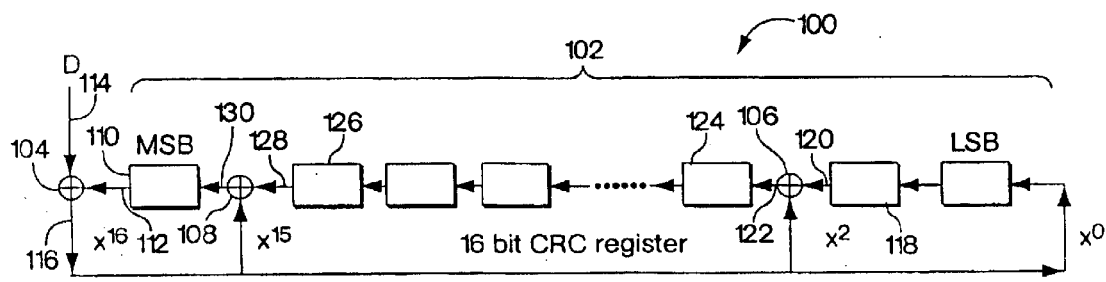
Fig. 2D
Prior Art

US 6,912,683 B2

1

METHOD, APPARATUS, AND PRODUCT FOR USE IN GENERATING CRC AND OTHER REMAINDER BASED CODES

PRIORITY CLAIM

This application claims priority under 35 USC section 119(e) of provisional application No. 60/183,197, filed on Feb. 17, 2000, entitled "Method and Apparatus for Rapidly Generating CRC Block Codes".

RELATED ART

Information systems are often exposed to noise and/or other phenomenon, which can lead to data errors. The data errors may occur during any of various processes including, but not limited to, during transmitting, storing, and/or retrieving of data. Consequently, various methods have been developed to help detect and/or correct errors should they occur.

It is known that signals may be represented as data (e.g., a message, word, byte, etc.) that may be viewed as a number or sequence of numbers (e.g., binary data may be viewed as a binary number). Any such number can be divided by a divisor (e.g., a binary number) to generate a remainder, which may be treated as a type of signature and used to detect errors in the data. For example, assume that the data to be transmitted represents a value of 82. The data can be divided by a predetermined divisor, for example, 7, to generate a remainder, e.g., 5. The remainder may be treated as a signature and transmitted along with the data. Then, if the received data is 81 rather than 82, the receiver, using the same predetermined divisor, will generate a remainder of 4 rather than 5, thereby indicating that the received data has an error.

Some systems employ cyclic redundancy check ("CRC") codes, which also may be viewed as a type of signature, to detect errors. For example, in some communication systems, a sender having a block of data to be transmitted, generates a CRC code for the block of data, and transmits both the block of data and the associated CRC code as an appended "checksum." The transmitted data and associated CRC code reach a receiver, which generates a CRC code for the received data block, and compares such CRC code to that transmitted by the sender, to determine whether the received data has an error.

Some CRC codes may be understood at least in part by recognizing that at least some data (for example, at least some binary data) may be viewed as representing a kind of polynomial (for example, the data may be viewed as representing coefficients of a polynomial in a dummy variable "x"), and by recognizing that the polynomial may be divided by a second polynomial to generate a remainder. The second polynomial is commonly referred to as a CRC polynomial and is typically known to the sender and the receiver and selected for certain properties which are well documented in literature. The CRC code is, or is based at least in part, on the remainder. By carefully selecting the CRC polynomial, any single bit error causes the remainder generated by the receiver to differ from the remainder generated by the sender, and to therefore be detectable.

Accordingly, it should be understood that although the discussion hereinbelow refers occasionally to polynomials, we are actually referring to processing data and are viewing the data as a polynomial or as terms of a polynomial to facilitate explanation only.

For example, FIG. 1A shows a representation of a block of binary data $D_1$, which is made up of a sequence of bit values "1101011011". The leftmost bit is the MSB, and the rightmost bit is the LSB. The sequence may be viewed as a

2 series of bits representing the coefficients $a_9 \ldots a_0$ of a polynomial in powers of a variable "x" ($a_9x^9+a_8x^8+a_7x^7+a_6x^6+a_5x^5+a_4x^4+a_3x^3+a_2x^2+a_1x^1+a_0x^0+$) which would thus have the following terms: $1x^9+1x^8+0x^7+1x^6+0x^5+1x^4+1x^3+0x^2+1x^1+1x^0$, (i.e., reducing to $x^9+x^8+x^6+x^5+x^3+x+1$). The LSB, "1", represents the coefficient of the $x^0$ term. The second most LSB, "1", represents the coefficient of the $x^1$ term. The third most LSB, "0", represents the coefficient of the $x^2$ term, and so on, such that the MSB, "1", represents a coefficient of a $x^9$ term. Note that because the sequence is made up of binary values, all of the coefficients are either "1" or "0". Hereafter, when we refer to a bit sequence as representing a polynomial, we mean that the bits represent the coefficients of the polynomial including terms with zero coefficients, or the coefficients of only non-zero terms, as appropriate.

FIG. 1B shows a representation of a bit string made up of a sequence "10011", which may be viewed as representing a polynomial that has the following terms: $x^4+x+1$, and serves as the CRC polynomial in this example. The degree of this CRC polynomial is four, based on the term having the highest exponent, i.e., $x^4$.

In this example, the polynomial represented by the data $D_1$ is to be divided by the CRC polynomial to generate a remainder. Referring to FIG. 1C, for purposes of this example, a number $D_2$ of "0" bits is first appended to the LSB of the block of data $D_1$, so that the remainder will have a particular form. The number of bits appended is chosen to be equal to four, the degree of the CRC polynomial. Thus, the block of data and the appended bits collectively make up the sequence "11010110110000". This sequence may be viewed as representing a polynomial $x^{13}+x^{12}+x^{10}+x^8+x^7+x^5+x^4$.

FIG. 2A shows the sequence $D_3$ of bits "11010110110000", formed by the block of data and the appended bits (FIG. 1C), being divided by the sequence $D_4$ of bits "10011", shown in FIG. 1B representing the CRC polynomial. It can be seen that the result at each step depends on results of the preceding steps. An error in any bit location in sequence $D_3$ typically causes the remainder $D_5$ to differ from the expected remainder. In this example, the sequence "1110", represents the remainder, which may be viewed as representing a polynomial $x^3+x^2+x$.

It should be recognized that subtraction steps employed in remainder calculation are typically not carried out using common binary subtraction but rather are carried out using modulo-two arithmetic and modulo-two subtraction. Addition and subtraction of polynomials has been developed from algebraic field theory. More specifically, if the data is binary-valued and the polynomials have binary-valued coefficients, the arithmetic is carried out over a Galois Field of 2.

FIG. 2B illustrates algebraic rules for binary-valued data over a Galois Field of 2. Note that there is no "carrying" in the algebraic rules for addition at 50, and no "borrowing" in the algebraic rules for subtraction at 52. As such, the algebraic rules for addition and the algebraic rules for subtraction are similar to modulo-two arithmetic and modulo-two subtraction, respectively, and are sometimes implemented using an EXCLUSIVE-OR function. The algebraic rule for multiplication, at 54, is sometimes implemented using an AND function.

While the above discussion and example are helpful to understand CRC codes, it should be understood that a system may employ CRC codes without any express reference to polynomial division. In practice, CRC methods have been implemented in a variety of ways, including, but not limited to, using a linear feedback shift register, a look up table, and/or combinations thereof.

FIG. 2C and FIG. 2D show examples of linear feedback shift registers (LFSR's). FIG. 2C shows one type of prior art LFSR 60 that is sometimes referred to as a back loaded LFSR. This particular back loaded LFSR 60 has a sixteen bit shift register 62, referred to as the CRC register, and further includes three XOR gates 64, 66, 68 operatively connected to the CRC register 62 as follows so as to enable the LFSR 60 to generate a CRC code for data based on a CRC polynomial having the following terms: $x^{16}+x^{15}+x^2+0$.

An output of a sixteenth bit 70, i.e., the MSB, of the CRC register is supplied to a first input of each of the XOR gates 64, 66, 68. The XOR gate 64 has a second input that receives the block of data D on a line 72, one bit at a time starting with the MSB of the block of data D, as further described below. An output of the XOR gate 64 is supplied on a line 74 to an input of a first bit 76, i.e., the LSB of the CRC register 62. The XOR gate 66 has a second input that receives an output of a second bit 78 of the CRC register 62 on a line 80. An output of the XOR gate 66 is supplied on a line 82 to an input of a third bit 84 of the CRC register 62. The XOR gate 68 has a second input that receives an output of a fifteenth bit 86 of the CRC register 62 on a line 88. An output of the XOR gate 68 is supplied on a line 90 to an input of the MSB 70 of the CRC register 62.

LFSR's such as that of FIG. 2C are often implemented in hardware and driven by a clock. It is common to append bits to the block of data D, for example as discussed above with respect to FIG. 1C, so that the remainder will have a particular form.

In operation, the CRC register 62 is often initialized (e.g., each bit in the CRC register is set to a logic "0" state) prior to use. At a first clock pulse, the MSB of the block of data D for which a CRC is desired is supplied through the XOR gate 64 to the LSB 76 of the CRC register 62. Every clock pulse thereafter, the data in the CRC register 62 is shifted one bit to the left and the next most MSB of the block of data D is supplied to the LSB 76 of the CRC register 62, by way of the XOR gate 64. If the MSB 70 of the CRC register 62 has a logic "1" state, then the bits of the CRC register 62 supplied by the XOR gates 64, 66, 68 are XOR'd with a logic state "1". If the last bit appended to the block of data D has been shifted into the CRC register 62, then the contents of the CRC register 62 indicates the remainder for the block of data D.

FIG. 2D shows a prior art LFSR 100 that is of a type sometimes referred to as a front loaded LFSR. With the front loaded LFSR 100 of FIG. 2D, there is often no need to append bits to the data D. As with the LFSR 60 of FIG. 2C, this front loaded LFSR 100 has a sixteen bit CRC register 102, and further includes three XOR gates 104, 106, 108 operatively connected to the CRC register 102 so as to enable the LFSR 100 to generate a CRC code for the data D based on a CRC polynomial having the following terms: $x^{16}+x^{15}+x^2+0$.

The XOR gates 104, 106, 108 are connected to the CRC register 102 and the data D is presented to the LFSR 100 as follows. An output of a sixteenth bit 110, i.e., the MSB, of the CRC register 102 is supplied on a line 112 to a first input of one of the XOR gates 104. The XOR gate 104 has a second input that receives the block of data D, one bit at a time starting with the MSB, on a line 114 as further described below. An output of the XOR gate 104 is supplied on a line 116 to an input of each of the other XOR gates 106, 108. The XOR gate 106 has a second input that receives an output of a second bit 118 of the CRC register 102 on a line 120. An output of the XOR gate 106 is supplied on a line 122 to an input of a third bit 124 of the CRC register 102. The XOR gate 108 has a second input that receives an output of a fifteenth bit 126 of the CRC register 102 on a line 128. An output of the XOR gate 108 is supplied on a line 130 to an input to the MSB 110 of the CRC register 102.

At a first clock pulse, an MSB of the block of data D and the output of the MSB 110 of the CRC register 102 are supplied to the XOR gate 104. Every clock pulse thereafter, the data in the CRC register 102 is shifted one bit to the left and the next most MSB of the data D is supplied to the XOR gate 104. If the output of the XOR gate 104 has a logic "1" state, then the bits of the CRC register supplied by the XOR gates 106, 108 are XOR'd with a logic state "1". If the last bit of the block of data D has been supplied to the XOR gate 104, then the contents of the CRC register 102 indicates the remainder for the block of data D.

FIG. 2E shows a functional block diagram of one type of prior art table driven implementation 140 for generating a CRC code. This particular table driven implementation 140 utilizes a 16 bit shift register 142 as the CRC register and is sometimes referred to as back loaded, as is the LFSR of FIG. 2C. A Look Up Table 144 is used to store a plurality of values, e.g., 256 16-bit values. It is common to append bits to the data D, for example as discussed above with respect to FIG. 1C, so that the remainder will have a particular form. In operation, bits are shifted as groups, e.g., 8 bits, into and out of the CRC register 142. Groups of bits into the CRC register 142 are supplied from the data D on lines 145. Groups of bits out of the CRC register 142 are supplied on lines 146 to the Look Up Table 144 and used to identify a location in the Look Up Table 144. The 16 bit value at the indentical location of the Look Up Table is output on lines 148 and XOR'd 150 with the 16 bit CRC register 142, and the result is stored in the CRC register 142. The operation is repeated until all of the bits that have been appended to the data D have been shifted into the CRC register 142. Then, the contents of the CRC register 142 indicates the remainder for the data D.

FIG. 2F shows a functional block diagram of another type of prior art table driven implementation 160 for generating a CRC code. This particular table driven implementation 160 utilizes a 16 bit shift register 162 as the CRC register and is sometimes referred to as front loaded, as is the LFSR of FIG. 2D. A Look Up Table 164 is used to store a plurality of values, e.g., 256 16 bit values. In operation, groups of bits, e.g., 8 bits, are shifted out of the CRC register 162 on lines 166 and XOR'ed 168 with a group of bits, e.g., 8 bits, shifted in from the data D for which a CRC code is desired. The result of the XOR'ing is supplied on lines 170 and used to identify a location in the Look Up Table 164. The data, e.g., the 16 bit value, at the indentified location in the Look Up Table is supplied on lines 172 and XOR'ed 174 with the 16 bit CRC register 162, and the result is stored in the CRC register 162. The operation is repeated until all of the bits of the data D have been supplied to the XOR 168, wherein the contents of the CRC register 162 then indicates the remainder for the data D.

FIG. 2G is a flowchart 180 of one prior art algorithm for carrying out a table driven implementation. The CRC register is initialized at a step 182, e.g., by setting all of the bits to a logic "0" state. At a step 184, a group of bits are shifted out of the CRC register and a group of bits are shifted in from the data D for which a CRC code is desired. A value of a register referred to as Table Index is set equal to a result of XOR'ing the group of bits shifted in from the data D with the group of bits shifted out from the CRC register. At a step 186, the CRC register is set equal to a result of XOR'ing the CRC register with the data in the Look Up Table at the location identified by the value of the Table Index register. At step 188, a determination is made as to whether there are any nore bits to shift in from the data D. If there are more bits to shift in, then execution returns to the step 184. If there are no more bits to shift in, then the algorithm ends and the content of the CRC register indicates the remainder for the data D.

FIG. 2H is a flowchart diagram 190 of another prior art algorithm for carrying out a table driven implementation.

The algorithm of FIG. 2H is similar to the algorithm of FIG. 2G except that the algorithm of FIG. 2H is intended for use in association with a processor having a pipelined architecture in which an instruction may be initiated before a preceding instruction is completed. The CRC register is initialized at a step 192, e.g., by setting all of the bits to a logic "0" state. At a step 194, a group of bits are shifted out of the CRC register and a group of bits are shifted in from the data D for which a CRC code is desired. A value of a register referred to as Table Index is set equal to a result of XOR'ing the group of bits shifted in from the data D with the group of bits shifted out from ate CRC register. A WAIT step 196 provides a delay to make sure that the previous step 194 is complete before proceeding to a subsequent step 198 in the algorithm. At the step 198, the CRC register is set equal to a result of XOR'ing the CRC register with the data in the Look Up Table at the location identified by the value of the Table Index register. The WAIT step 196 is needed because the step 198 requires the result from the step 194, yet as stated above, the pipeline architecture enables an instruction to be initiated before a proceeding instruction is complete. Another WAIT step 200 provides a delay to make sure that the step 198 is complete before proceeding to subsequent steps in the algorithm. At a step 202, determination is made as to whether there are any more bits to shift in from the data D. If there are more bits to shift in, then execution returns to the step 194. If there are no more bits to shift in, then the algorithm ends and the contents of the CRC register indicates the remainder for the data D. The WAIT step 200 is needed because the step 194 requires the result fit it the step 198. The duration of the WAIT step 200 is typically greater than that of the WAIT step 196 because more time is typically needed to complete the step 198 that is needed to complete the step 194.

Because of the WAIT steps 196, 200, the algorithm is not able to fully utilize the pipelined architecture for computation of the CRC. It should be understood however, that during the WAIT steps 196, 200, the pipelined architecture processor may perform other computations, unrelated to computation of the CRC.

In some communication systems, such as for example those that employ packet switching, parts of a block of data may be received or generated out of order. If such systems use CRC codes for error detection, the system often waits idle until all of the parts of the block of data have been received or generated, and only then generates and evaluates the CRC code for the block of data. In such systems, it would be desirable to be able to begin generating the CRC code as the parts of the block of data are received or generated, so that the amount of time needed to complete the CRC code, measured from the point in time that the final part of the block of data is received or generated, is reduced. It would be desirable to be able to spread the computational burden over a large fraction of the duration during which the parts of the data is being received or generated.

Ng et al. have suggested a parallel realization for generating the CRC for the header that carries routing information in an asynchronous transfer mode (ATM) protocol (See "Parallel realization of the ATM cell header CRC", School of Electrical Engineering, University of New South Wales, Sydney 2052, Australia.). However, such realization is somewhat analogous to a look up table and does not overcome the shortcomings described above.

SUMMARY

It has been determined that the task of generating a CRC code for data can be accomplished by generating a plurality of preliminary CRC codes and by synthesizing the CRC code in response at least in part to the preliminary CRC codes.

According to a first aspect of the present invention, a method implemented by a data processor includes generating a plurality of preliminary CRC codes in response at least to specified data, and synthesizing a CRC code for the specified data, in response at least to the plurality of preliminary CRC codes.

In accordance with one embodiment, generating a plurality of preliminary CRC codes comprises partitioning the specified data into at least two portions, and generating at least two preliminary CRC codes, each being associated with and being generated in response at least to a respective one of the at least two portions.

According to another aspect of the present invention, a data processor includes means for generating, a plurality of preliminary CRC codes in response to specified data, and means for synthesizing a CRC code for the specified data, in response at least to the plurality of preliminary CRC codes.

Here, when we use the term "in response to" we mean "in response at least to", so as not to preclude being responsive to more than one thing.

According to another aspect of the present invention, a data processor generates a plurality of preliminary CRC codes in response to specified data, and synthesizes a CRC code for the specified data, in response to the plurality of preliminary CRC codes.

According to another aspect of the present invention, an information system includes at least one data processor that generates a plurality of preliminary CRC codes in response to portions of specified data, and synthesizes a CRC code for the specified data in response to the plurality of preliminary CRC codes.

According to another aspect of the present invention, a product includes, a computer readable media, and information stored on the computer readable media to cause a computer to carry out a method for generating a CRC code for specified data, the method including generating a plurality of preliminary CRC codes in response to the specified data, and synthesizing a CRC code for the specified data, in response to the plurality of preliminary CRC codes.

According to another aspect of the present invention, a communication signal includes information to cause a computer to carry out a method for generating a CRC code for specified data, the method including generating a plurality of preliminary CRC codes in response to the specified data, and synthesizing a CRC code for the specified data, in response to the plurality of preliminary CRC codes.

One or more embodiments of one or more aspects of the present invention may be used to reduce the amount of time required to generate a CRC code and thereby improve performance, of a system utilizing CRC codes for error detection. For example, some communication systems use a protocol wherein the sender transmits a first block of data but does not transmit a second block of data until the receiver sends a reply indicating that the first block of data has been specified and that no errors have been detected. If such systems use CRC codes for error detection, the receiver must generate and evaluate the CRC code before the sender will begin transmitting the second block of data. Thus, the time required for the receiver to generate the CRC becomes a limitation on system performance. This problem can become more significant as system requirements increase and thereby lead to demands for greater bandwidth or throughput (e.g., higher effective bit rates). While one might expect that the advent of systems having multiple processors could help alleviate the problem above, this is not necessarily the case. For example, as to prior art methods that generate CRC codes in a serial fashion, each step depends on the results of the preceding steps. It is thus difficult for such prior art methods to take advantage of multiple processors to achieve faster CRC, code generation.

It has been recognized that aspects of the present invention are not limited to CRC codes, but rather may be applied to remainder-based codes and operations in general, where a quotient is net absolutely required. CRC codes can be viewed as one category of remainder-based codes. Another category of remainder-based operations is cryptographic systems. In some applications of cryptographic systems, large keys are manipulated (mod n). One or more aspects of the present invention have applicability to remainder-based codes and operations in general, including but not limited to CRC codes and cryptographic systems. Further, one or more particular embodiments of the invention may be used to greatly reduce the time needed to manipulate large keys that may be associated with cryptographic systems.

However, it should be understood that there is no requirement that any of the aspects of the present invention address the short comings of the prior art.

BRIEF DESCRIPTION OF THE DRAWINGS

FIG. 2B illustrates algebraic roles for binary valued data over a Galois Field of 2;

FIGS. 2C and 2D show examples of linear feedback shift registers (LFSR's);

DETAILED DESCRIPTION

Figure 3A:
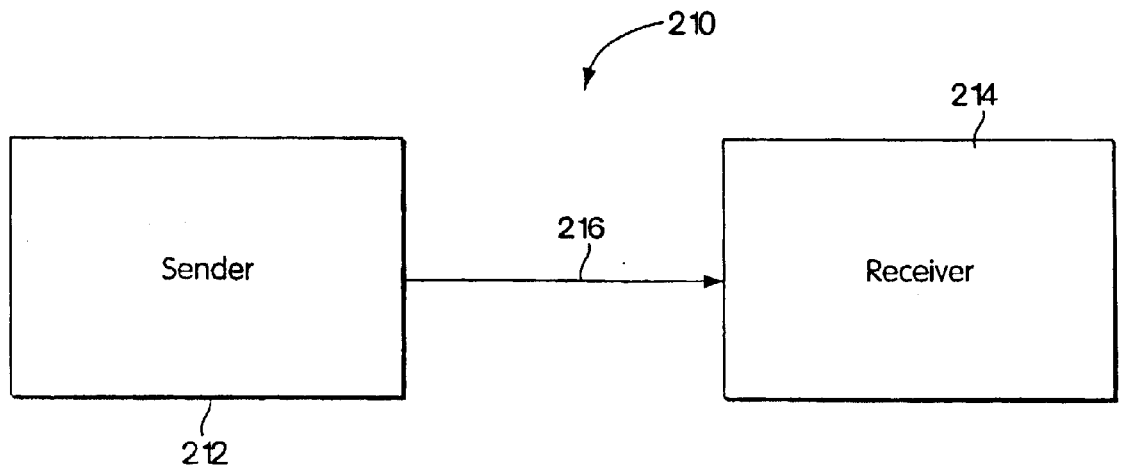
FIG. 3A is a schematic block diagram of an information system.

FIG. 3A is a schematic block diagram of a communication system 210 in which various embodiments of the present invention may be used. Communication systems are one type of information system and are used to transfer information, for example between a source and a destination, via a communication link, or transmission channel. Examples of communication systems include dedicated point-to-point systems, wired networks, cellular telephone systems, and a data bus between components of a system, e.g., between a CPU and a storage device and/or between storage devices. A storage medium such as a magnetic disk also may be viewed as a communication link (or portion thereof), with a read/write head being both sender and receiver. It should be further understood that the present invention may be used by any type of information system including but not limited to communication systems.

The communication system 210 comprises a sender 212, a receiver 214, and a communication link 216 coupled therebetween. The communication link 216 may be any type of communication link, including but not limited to, for example, wired (e.g., conductors, fiber optic cables) or wireless (e.g, microwave links, satellite links, ), and combinations thereof, each of which may be public or private, dedicated, and/or shared, e.g., a network. The communication link 216 may employ circuit switching or packet switching, or combinations thereof. A communication link may employ any protocol or combination of protocols including but not limited to the Internet Protocol. The sender 212 and the receiver 214 may each include any type of interface to the communication link 216, including but not limited to for example, a modem, an Ethernet interface, a wireless interface, or any combination thereof.

Figure 3B:
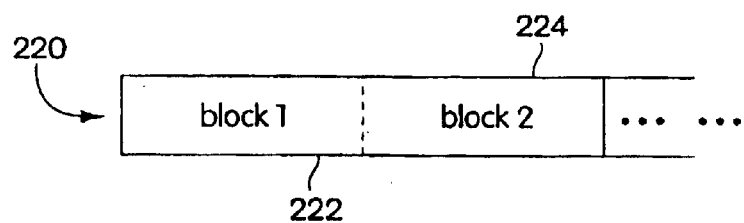
FIG. 3B is a representation of data which is sought to be transferred from the sender to the receiver.

FIG. 3B shows a representation 220 of data which is sought to be transferred from the sender 212 to the receiver 214. The data may be any type of information including, but not limited to, message data, non-message data, and combinations thereof. Generally speaking, data may be from any source. For example, in regard to data residing within the sender 212, the data may be from one or more sources external to the sender 212, sources internal to the sender 212, or any combination thereof. The data may have any form, including, but not limited to, a sequence of binary values, i.e. a bit string. The data may or may not be divided into blocks (e.g., blocks 222, 224) as shown. If divided into blocks, the amount of data in a block may be predetermined (e.g., specified and/or agreed upon in advance) or determined dynamically, and may be fixed (e.g., uniform) or variable.

It should be further understood that the present invention is not limited to data that is to be transferred from the sender to the receiver but rather may be used with any specified data including, but not limited to, data that is to be transferred, data that has been received, data that has been received and modified, data that has been generated in response to data that has been received, data that is to be used to generate data that is to be transferred, or any other data that is neither to be transferred nor has been received. As used herein, the term specified is defined as to be specified by any source including, but not limited to, the sender, the receiver, the system, or any combination thereof. The data may be specified in any way, shape or form.

The sender 212 generates one or more CRC codes for the data. For example, if the data is divided into blocks, then the sender 212 may generate a CRC code for each one of the blocks of data. The characteristics of the CRC code are typically known by the sender 212 and the receiver 214, but may or may not be predetermined, and may or may not be uniform.

There are many different types of CRC codes, a few of which are listed below:

(1) reflected data implementations;
(2) reversed data implementations;
(3) reversed polynomial implementations;
(4) initialized value implementations;
(5) reversed final value implementations;
(6) XOR'ed initial value implementations;
(7) XOR'ed final value implementations;

These and some of the other types of CRC codes are discussed in, among others, the following references: Patrick Geremia, Application Report SPRA530, Cyclic Redundancy Check Computation: An Implementation Using the TMS320C54x, Digital Signal Processing Solutions, April 1999, pages 1–35; Ross N. Williams, "A Painless Guide to CRC Error Detection Algorithms", ftp://ftp.rocksoft.com/clients/rocksoft/papers/crc v3.txt Aug. 19, 1993, pages 1–32 (includes "Program for Writing CRC Lookup Table", Jun. 3, 1993 and header file for the reference implementation of the Rocksoft TM model CRC Algorithm); Terry Ritter, "The Great CRC Mystery", Dr. Dobb's Journal of Software Tools, http://www.io.com/-ritter/ARTS/CRCMYST.HTM, February 11(2): 26–34, 76–83, Listing One (CRCLIST1.HTM), pages 1–7, Listing Two (CRCLIST2.HTM), pages 1–10 February 1986; Seong Leong Ng and Bill Dewar, Computer Communications 19 (1996) 257–263 "Parallel Realization of the ATM Cell Header CRC, School of Electrical Engineering, University of New South Wales, Sydney 2052, Australia, pages 258–263; R. J. Glaise, "A Two-Step Computation of Cyclic Redundancy Code CRC-32 for ATM Networks, http://www.research.ibm.com/journal/rd/416/flaise.txt 1997, pages 1–5; Andrew S. Tanenbaum, Computer Networks, Prentice-Hall, Inc., Englewood Cliffs, N.J., 1981, pages 129–133.

Figure 3C:
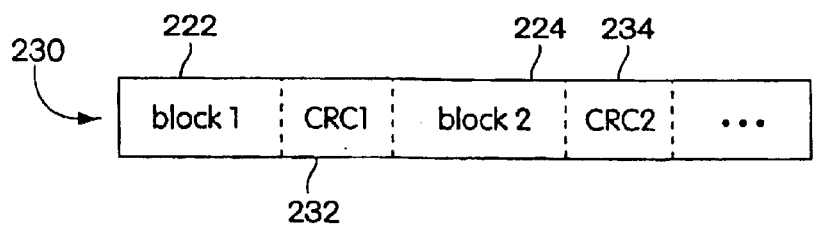
FIG. 3C is a representation of a data stream that includes data and CRC code(s)

Referring to FIG. 3C, the data and any CRC code(s), e.g., 232, 234, may be combined to form a data stream 230. The data stream 230 may or may not be supplied directly to the communication link 216 (FIG. 3A). For example the data stream 230 may be supplied to the communication link 216 (FIG. 3A) by way of one or more encoders that encode the data stream 230, for example, to compress the data stream 2320.

In the embodiment of FIG. 3C, each CRC code, e.g., 232, 234 is appended to the associated data block, e.g., 222, 224, respectively. It should be understood however, the CRC code(s) and the data may be combined in any way. For example, in other embodiments, the CRC code need not be appended to the associated block of data, but rather, may be positioned anywhere and or may be integrated with the associated data block. Further, in some embodiments, the sender 212 combines the CRC code with the data in such a way that the result represents a polynomial that is evenly divisible by a CRC polynomial. In such embodiments, the receiver 214 may perform a cyclic redundancy check on the data and CRC code, as combined, and may assume that there is no error if the remainder is equal to zero.

The size of the CRC code may depend on the CRC polynomial, and may be small relative to the size of the block of data, although none of these are requirements for the present invention. The size of the CRC code is often a number in a range of three bits to thirty-two bits, inclusive.

It has been determined that the task of generating a CRC code for data can be accomplished by generating a plurality of preliminary CRC codes based on the data, at least in part, and by synthesizing the CRC code for the data based on the preliminary CRC codes, at least in part. A preliminary CRC code is defined herein as a CRC code that is not the CRC code for the data but rather is used in the generation of the CRC code for the data.

Before proceeding, we first provide an example, using decimal values, that demonstrates how a remainder may be synthesized based on a plurality of preliminary remainders. Assume again that the data represents a value of 82, which can be divided by a divisor, for example, 7 to generate a remainder. It has been recognized that the value 82 may be expressed as follows:

$$82 = 80+2 \qquad \text{eq. 1}$$

$$= (8*10)+2 \qquad \text{eq. 2}$$

and that:

$$82/7 = ((8*10)+2)/7 \qquad \text{eq. 3}$$

$$\text{remainder }(82/7) = \text{remainder }(((8*10)+2)/7) \qquad \text{eq. 4}$$

The following relations can be adapted to the above, for example to help generate the remainder:

$$(a+b) \bmod c = (a \bmod c) + (b \bmod c) \qquad \text{eq. 5}$$

$$(a*b) \bmod c = (a \bmod c) * (b \bmod c) \qquad \text{eq. 6}$$

Using equations 5 and 6, the expression on the right side of equation 4 can be expanded as follows:

$$\text{remainder}(82/7) = \text{remainder}((8*10)/7) + \text{remainder}(2/7) \qquad \text{eq. 7}$$

$$\text{remainder}(82/7) = \text{remainder}(8/7) * \text{remainder}(10/7) + \text{remainder}(2/7) \qquad \text{eq. 8}$$

The remainder quantities in the expression on the right side of equation 8 are examples of preliminary remainders. The remainder of 82/7 may be generated from these preliminary remainders in accordance with the expression on the right side of equation 8 as follows:

$$\text{remainder}(82/7) = 1*3+2 \qquad \text{eq. 9}$$

$$= 5 \qquad \text{eq. 10}$$

Figure 1A:
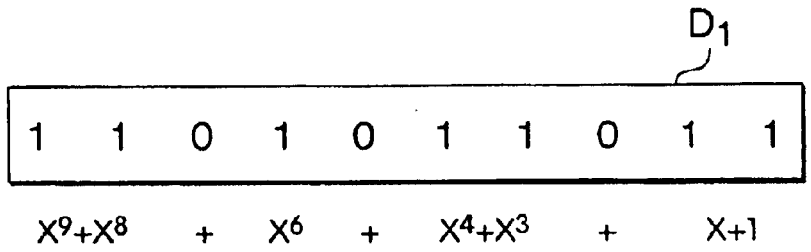
FIG. 1A is a representation of a data block as known in the prior art comprising a bit string that comprises the sequence "1101011011" and which may be viewed as representing a polynomial $x^9+x^8+x^6+x^5+x^3+x+1$.
Figure 1B:
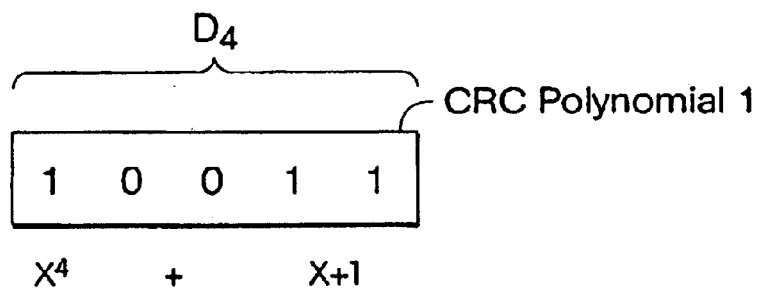
FIG. 1B is a representation of a bit string as known in the prior art that comprises the sequence "10011" and which nay be viewed as representing a CRC polynomial $x^4+x+1$.
Figure 1C:
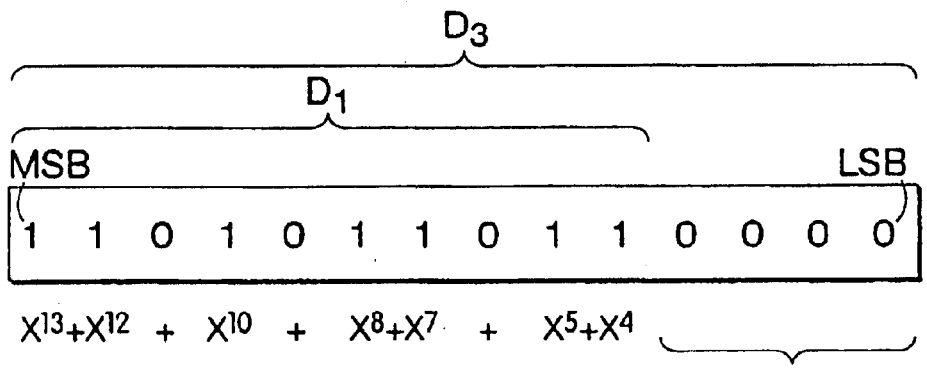
FIG. 1C is an example of bit string formed by appending four zeros to the data block of FIG. 1A.

FIGS. 4A through FIG. 4F, shows an example, using binary valued data, of how a CRC code for data may be generated by generating a plurality of preliminary CRC codes based on the data, at least in part, and by synthesizing the CRC code for the data based on the preliminary CRC codes. In this example, the data is a block D of bits comprising the bit string "11010110110000" of FIG. 1C. As stated above with respect to FIG. 1C, the block D can be viewed as representing a polynomial that has the terms $x^{13}+x^{12}+x^{10}+x^8+x^7+x^5+x^4$. The CRC polynomial is the CRC polynomial of FIG. 1B, represented by the bit string "10011", which as stated above with respect to FIG. 1B, may be viewed as representing a polynomial that has the terms $x^4+x+1$.

Figures 4A, 4B, 4C, 4D, 4E, 4F:
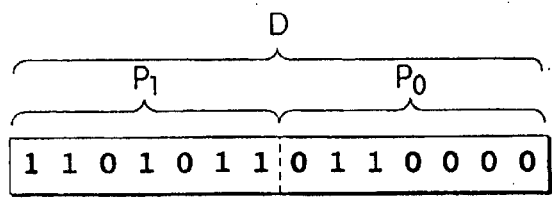
FIGS. 4A through 4F, is a representation of steps carried out in one embodiment of one aspect of the present invention to a generate a CRC code for the polynomial represented by bit string of FIG. 1C.

Referring to FIG. 4A, in this example, a first step in generating a plurality of preliminary CRC codes is to partition the block D into portions e.g., two portions $P_0$ and $P_1$. Here, the first portion $P_0$ comprises a bit sequence "0110000", i.e., bit zero through bit six of the block D. The second portion $P_1$ comprises a bit sequence "1101011", i.e., bits seven through thirteen of block D.

The portions $P_0$ may be viewed as representing a polynomial and the portion $P_1$ can be viewed as representing a polynomial. In this view, the first portion $P_0$ can be viewed as representing a polynomial having terms: $x^5+x^4$. The second portion $P_1$ can be viewed as representing a polynomial having terms: $x^6+x^5+x^3+x+1$.

However, the portions can also be viewed as representing portions of the polynomial represented by the block of data D. In this view, the first portion $P_0$ represents the $x^5+x^4$ terms of the polynomial represented by the block D. The second portion $P_1$ represents the $x^{13}+x^{12}+x^{10}+x^8+x^7$ terms of the polynomial represented by the block D. These terms represented by the second portion $P_1$ can be expressed as a product of two factors: $(x^6+x^5+x^3+x+1)*x^7$. The factor $x^7$ is indicative of the position of the second portion $P_1$ within the block of data, and more particularly, indicative of the bit-wise position of the LSB of the second portion $P_1$ within the block of data. Consequently, for other portion sizes, an appropriate factor may be other than x?

Thus, as to the polynomial, $P_D$ represented by the block of data D, the following relation can be stated:

$$P_D=(x^6+x^5+x^3+x+1)*x^7+(x^5+x^4) \quad \text{eq. 11}$$

$$=P_1*x^7+P_0 \quad \text{eq. 12}$$

where $P_D$=polynomial represented by the block of data D
$P_1$=polynomial represented by the second portion $P_1$
$P_0$=polynomial represented by the first portion $P_0$ To generate the CRC code in this example, it is desired to determine the remainder of a polynomial division operation in which the dividend is the polynomial represented by the block D, and the divisor is the CRC polynomial. As to the remainder, the following relation can be stated:

$$\text{remainder }(P_D)=\text{remainder }(P_1*x^7+P_0) \quad \text{eq. 13}$$

where remainder ($P_D$)=remainder of (polynomial represented by (D) divided by the CRC polynomial)
remainder ($P_1*x^7+P_0$)=remainder of (polynomial represented by $P_1*x^7+P_0$ divided by the CRC polynomial)

The following relations can be adapted to help generate a remainder for the block D based on portions of the block D:

$$(a+b)\bmod c=(a \text{ and } c)+(b \bmod c) \quad \text{eq. 14}$$

$$(a*b)\bmod c=(a \bmod c)*(b \bmod c) \quad \text{eq. 15}$$

So that, as to the remainder($P_D$), the expression on the right side of eq. 3 can be expanded to obtain the following:

$$\text{remainder }(P_D)=\text{remainder }(P_1*x^7)+\text{remainder }(P_0) \quad \text{eq. 16}$$

$$\text{remainder }(P_D)=\text{remainder}(P_1)*\text{remainder}(x^7)+\text{remainder}(P_0) \quad \text{eq. 17}$$

FIG. 4B through FIG. 4E show a representation of steps that may be used to compute the remainders in the expression co the right side of eq. 17.

Referring to FIG. 4B, the second portion $P_1$ which as stated above represents the polynomial $x^6+x^5+x^3+x+1$, is divided by the bit string "10011", representing the CRC polynomial $x^5+x^4$, to generate a bit string "00001" representing a remainder of 1.

Referring to FIG. 4C, the polynomial $x_7$, represented by the bit sequence "10000000", primarily on the size of the CRC polynomial, rather than the size of the data block. The product represents the remainder for the terms $x^{13}+x^{12}+x^{10}+x^8+x^7$ of the polynomial represented by the block of data D. As stated above, the terms $x^{13}+x^{12}+x^{10}+x^8+x^7$ are the polynomial terms represented by the block D that are represented by the second portion $P_1$ of the block D.

Referring to FIG. 4E, the first portion $P_0$, i.e., the bit sequence "0110000", which as stated above represents the polynomial $x^5+x^4$, is divided by the bit string "10011", representing the CRC polynomial, to generate a remainder "0101", which represents the polynomial $x_2+1$. This remainder is not only the remainder for the polynomial represented by the first portion $P_0$, but is also the remainder for the $x^5+x^4$ terms of the polynomial represented by the block D. As stated above, the $x^5+x^4$ terms are the non-zero terms of the polynomial represented by the first portion $P_0$ of the block D.

Referring to FIG. 4F, the remainder of the division of FIG. 4E, i.e., represented in this instance by the bit string "0101", is added to the product of FIG. 4D, i.e., represented in this instance by the bit string "1011", to generate a bit sequence "1110", representing a polynomial $x^3+x^2+x$. This sum represents the remainder for the polynomial represented by the block of data D.

Figure 2A:
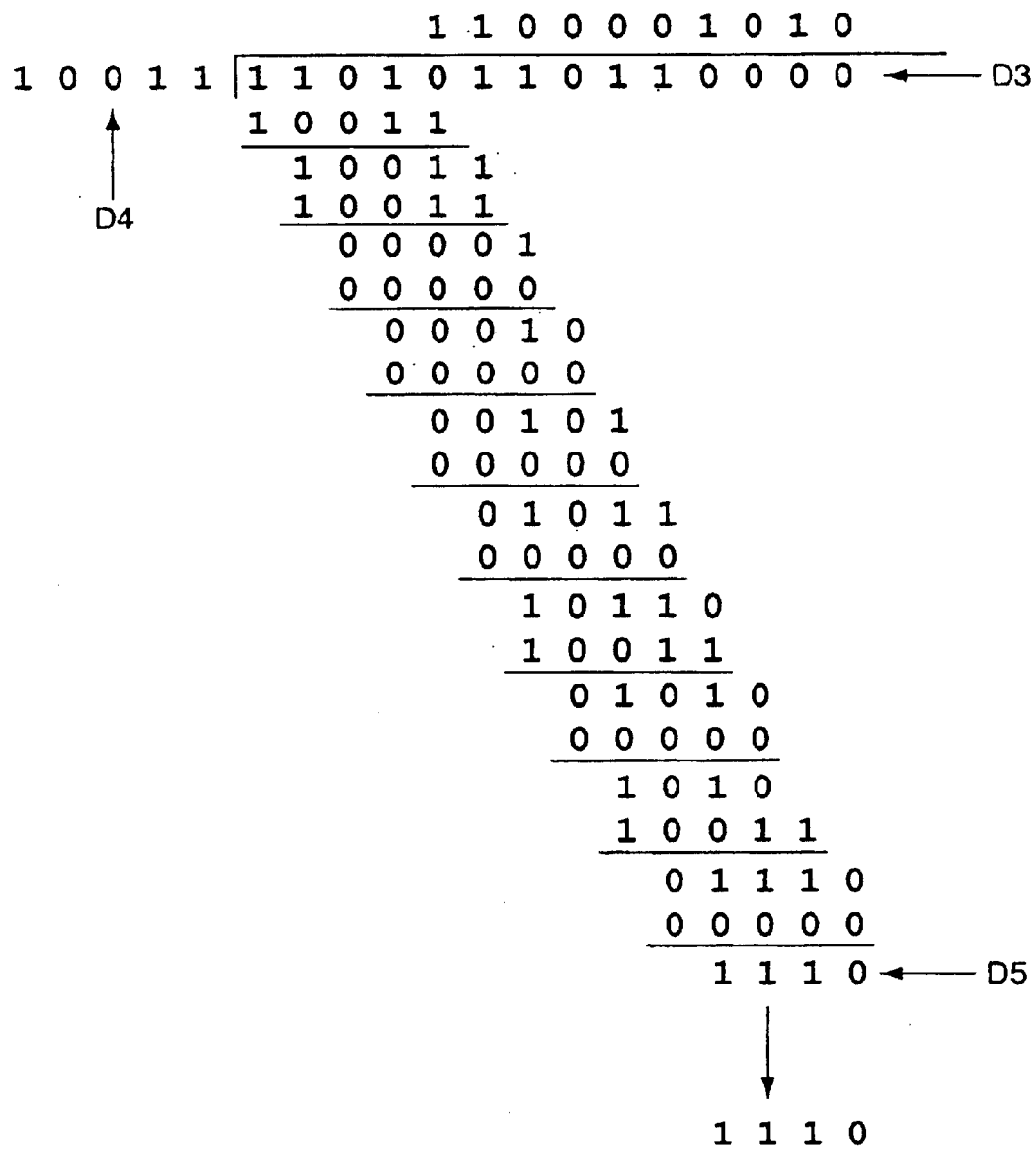
FIG. 2A is a representation of operations carried out in a prior art system to generate a CRC remainder for the bit string of FIG. 1C and the CRC polynomial of FIG. 1B.
Figure 2E:
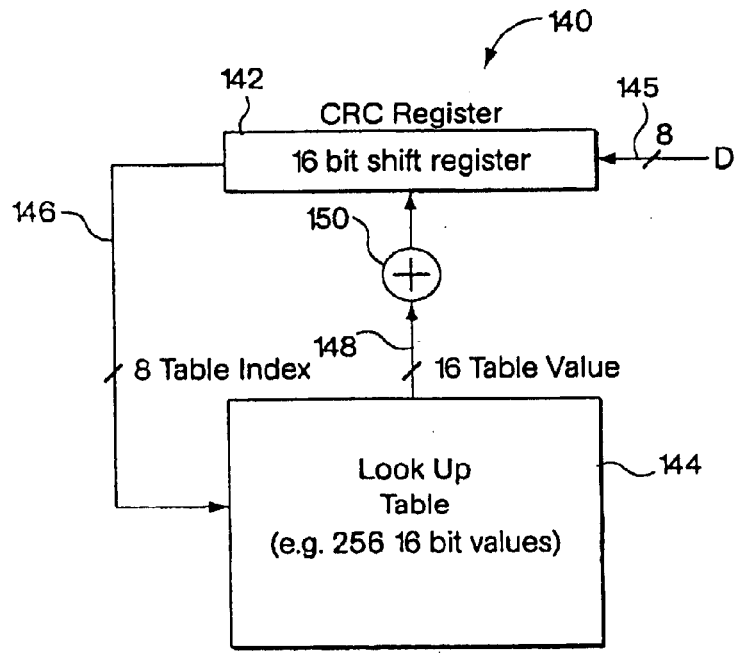
FIG. 2E shows a functional block diagram of one type of table driven implementation for generating a CRC code.
Figure 2F:
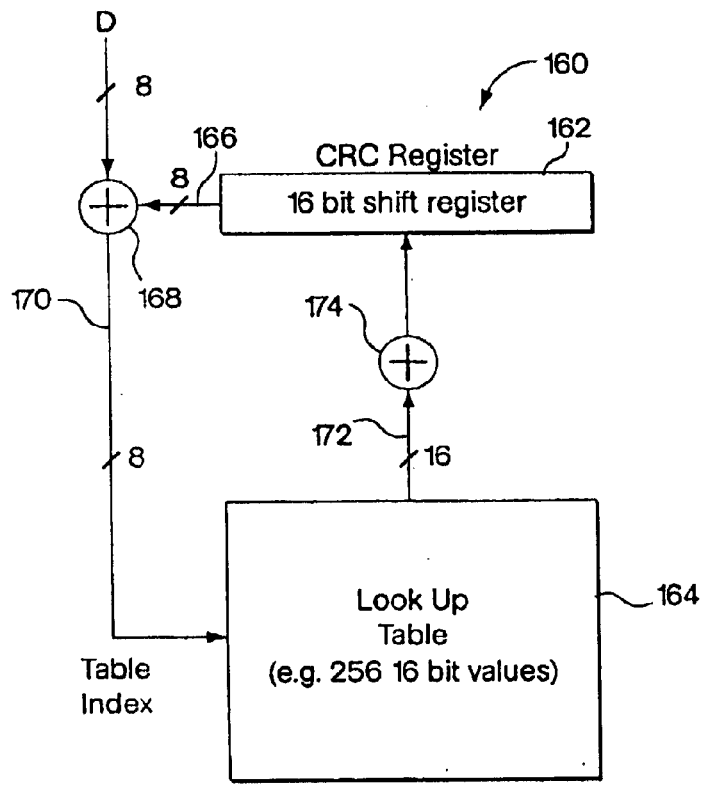
FIG. 2F shows a functional block diagram of another type of table driven implementation for generating a CRC code.
Figure 2G:
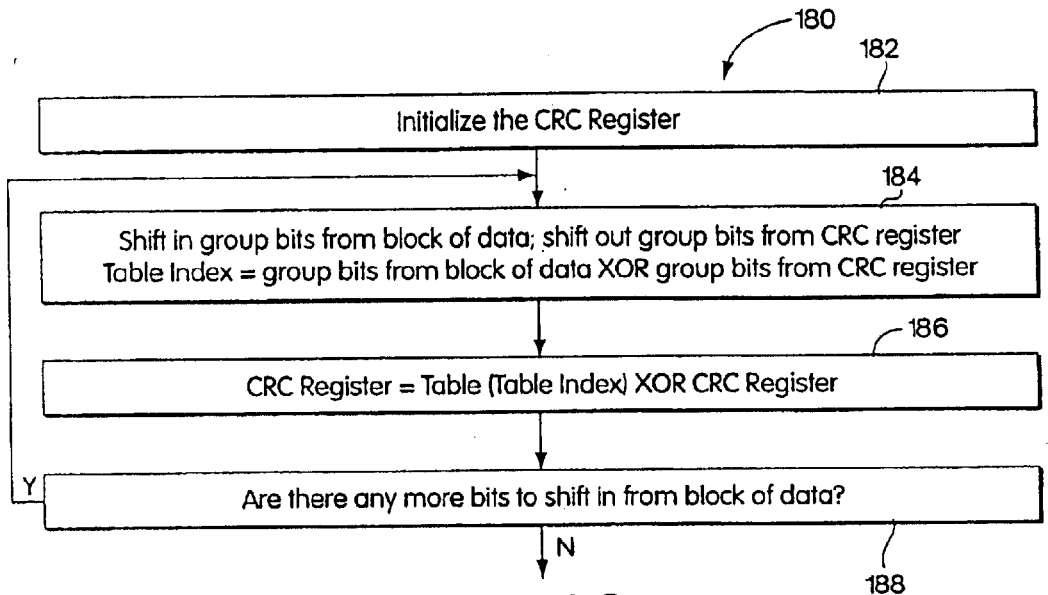
FIG. 2G is a flowchart of one algorithm for carrying out a table driven implementation.

It should be recognized that the remainder produced in FIG. 4F for the polynomial represented by the block of data D, is identical to the remainder generated by the prior art in the example shown in FIG. 2A.

Referring again to FIG. 4F, in the event that the remainder is greater than or equal to the CRC polynomial, then the remainder may be further reduced by dividing the remainder by the CRC polynomial so as to obtain a remainder that is less than the CRC polynomial, i.e., the divisor.

Thus, FIGS. 4A through 4F show one example of how to accomplish the task of generating a CRC code for a data block by generating a plurality of preliminary CRC codes based on the data block (at least in part), and by synthesizing the CRC code for the data block based on the preliminary CRC codes (at least in part).

As stated above, the polynomial term $x^7$ in equations 11–13, 16 and 17, and which is represented by the bit string "10000000" in FIG. 4C, is indicative of the position of the second portion $P_1$ within the block of data, and more particularly, indicative of the bit-wise position of the LSB of the second portion $P_1$ within the block of data. Hereafter a polynomial indicative of the position of a portion $P_1$ will be generalized as $x^{startj}$, where portion $P_j$ has an LSB located at bit position startj within the block of data.

Note that the remainder for $x^7$ (more generally $x^{startj}$ where startj is equal to 7), need not be computed (FIG. 4C) every tie but rather the remainder may be computed once (or alternatively, predetermined), stored and accessed as needed. As used herein, generating includes generating in any way including but not limited to computing, accessing predetermined stored data (e.g., in a look up table), and/or combinations thereof.

It should be recognized that the example of FIGS. 4A–4F is presented only for illustrative purposes, and that the present invention is not limited by the example. Furthermore, it should be understood that the various aspects of the present invention may be embodied without any reference to polynomials or polynomial division, which are merely an analytical tool.

In some embodiments, the remainders for the two portions may be generated (e.g., FIG. 4B, FIG. 4E) in parallel (i.e., concurrently or partially concurrently) with one another. For example, the block of data D may be partitioned into two approximately equal size portions (e.g., as shown in FIG. 4A by portions $P_0$ and $P_0$) whereby the elapsed time required to generate the two remainders will be approximately one-half the time required to generate the remainder without partitioning (FIG. 2A). A multiply operation (e.g., FIG. 4D), an addition operation (e.g., FIG. 4F), and if necessary, a reduction operation (e.g., if the sum is greater than or equal to the CRC polynomial, see discussion above with respect to FIG. 4F) may be performed, resulting in a remainder for the block of data D (e.g., FIG. 4F). For such example, the time required to generate a remainder for an N-bit data block may be approximated as:

$$t_{crc2}(n)=t_{crc}(n/2)+m \qquad \text{eq. 18}$$

where $t_{crc}(n)$=the amount time required to generate a remainder for an N-bit block of data wit out partitioning the block of data, and m=the amount of time required for a multiply operation, as addition operation, and if needed, a further reduction operation.

A reduction by fifty percent in the amount of time needed to generate a CRC code can prove a significant improvement in the performance of some systems, particularly in those systems where the amount of time needed to generate a CRC code has a significant impact on system throughput.

Nonetheless, it should be recognized that there is no requirement that CRC codes be generated in parallel or that the time required to generate a CRC code be expressed by eq. 18.

Figure 5A:
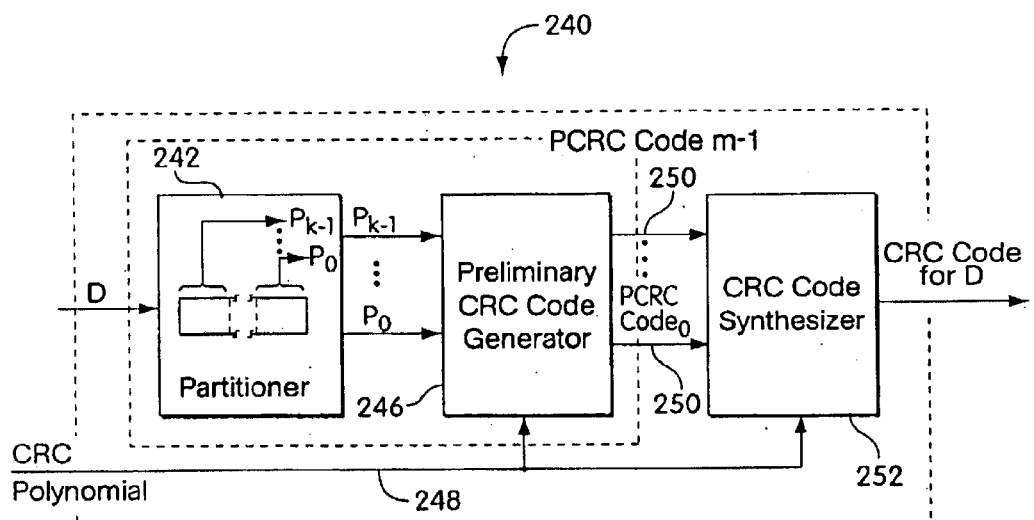
FIG. 5A is a schematic block diagram of a system for generating a CRC code according to one embodiment of the present invention.

FIG. 5A is a schematic block diagram of a data processor 240 according to one embodiment of one aspect of the present invention, which may, for example, be used in the communication system 210 of FIG. 3A to generate a CRC code for a block of data D.

As used herein, the term data processor is defined as any type of processor. For example, the data processor may be programmable or non-programmable, general purpose or special purpose, dedicated or non-dedicated, distributed or non-distributed, shared or not shared, and/or any combination thereof. A data processor may comprise hardware, software, firmware, hardwired circuits and or any combination thereof. The data processor may or may not include one or more computer program with one or a plurality of subroutines, or modules, each of which includes a plurality of instructions to be executed by the data processor, and may or may not perform tasks in addition to those associated with generating a CRC code. If the data processor includes more then one module, the modules may be parts of one computer program, or may be parts of separate computer programs.

The data processor 240 includes a partitioner 242 which receives a block of data D and partitions the block of data D into a plurality of portions, e.g., k portions shown as a first portion $P_0$ through a kth portion $P_{k-1}$. As used herein, the term portion is defined as any part or parts of the data. The portions may have any form and may be generated in any way. A portion may, for example, be a part of a bit string. If a portion comprises a plurality of bits, the bits need not be adjacent to one another in the block of data. The portions may or may not be physically separated from one another. Portions may overlap or not overlap. The number and/or size of each of the plurality of portions may or may not be predetermined. Although the first portion $P_0$ and the kth portion $P_{k-1}$ are shown as approximately equally sized and non-overlapping, there are no such requirements. In some embodiments, it may be advantageous to partition the bit string such that the portions do not have the same number of bits as one another, as discussed hereinbelow.

Figure 5B:
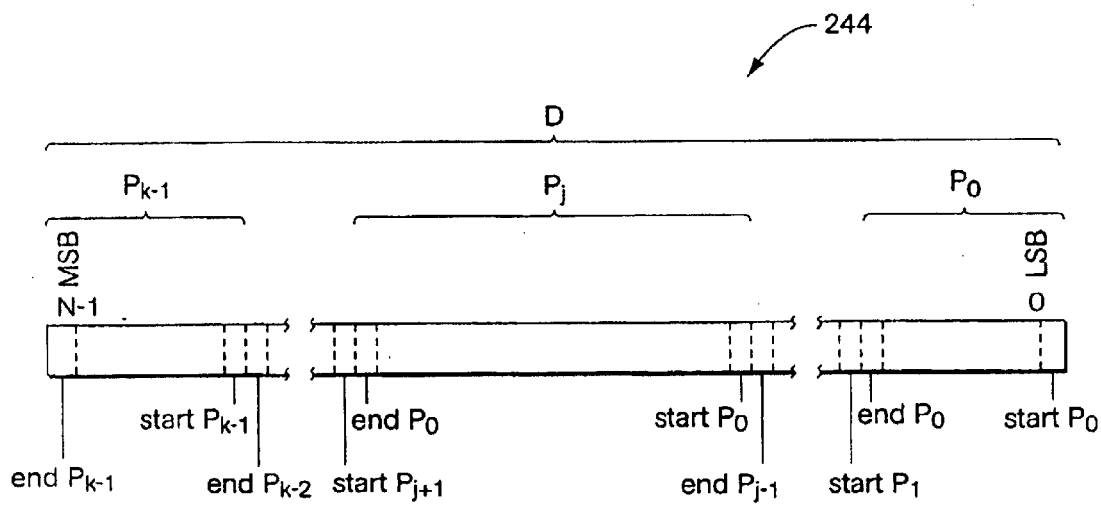
FIG. 5B illustrates characteristics of one embodiment of the partitioner of the data processor of FIG. 5A.

FIG. 5B shows characteristics 244 of one embodiment of the partitioner 242. This embodiment of the partitioner 242 receives a block of data D that comprises a bit string, and partitions the bit string into k portions, $P_0$ through $P_{k-1}$. The bit string has N bits including an LSB, bit 0, and an MSB, bit N-1. Portion $P_0$ comprises bit start $P_0$ (i.e., the LSB, bit 0) of the data string trough bit end $P_0$ of the data string. Portion $P_0$ comprises bit start $P_j$ of the data string through bit end $P_j$ of the data string. Portion $P_{k-1}$ comprises bit start $P_{k-1}$ of the data string through bit end $P_{k-1}$ (i.e., the MSB, bit N-1) of the data string.

Referring again to FIG. 5A, the plurality of portions are supplied to a preliminary CRC code generator 246, which further receives data representing a CRC polynomial on a line 248. Any CRC polynomial may be used. The CRC polynomial is known by the sender 212 and the receiver 214, and may or may not be fixed. The CRC polynomial may have any form, including but not limited to, a sequence of binary values, i.e., a bit string.

The preliminary CRC code generator 246 generates data indicative of a plurality of CRC codes, e.g., m CRC codes, which may be identified as $CRC\ code_0$ through $CRC\ code_{m-1}$, referred to hereafter as preliminary CRC codes, or PCRC codes, so as to distinguish them from the CRC code that is to be generated in response to the preliminary CRC codes or PCRC codes. In some embodiments, each of the plurality of PCRC codes is associated with a respective one of the plurality of portions of the data block. The value of m may or may not be equal to the value of k. The plurality of PCRC codes are preferably generated independently of one another, and may or may not be generated in parallel with one another. As used herein, independent of one another is defined as not dependent on one another. Generated in parallel is defined as to be generated at least partially concurrently with one another. To operate in parallel with one another is defined as to operate at least partially concurrently with one another.

The plurality of PCRC codes are supplied on a plurality of lines 250 to a CRC synthesizer 252, which synthesizes data indicative of a CRC code for the block of data D in response thereto. As used herein, the term synthesize is defined as to generate in any way, shape or form, but does not include simply appending the plurality of PCRC codes to one another.

As stated above, the term in response to is defined herein as in response at least to, so as not to preclude being responsive to more than one thing. Similarly, the term in response thereto is defined herein as in response at least thereto, so as not to preclude being responsive to more than one thing.

As used herein, a CRC code, which includes PCRC codes, is defined as anode having a specified relation to data indicative of a remainder. The specified relation may be any type of relation, or any combination of any type of relations. It should be understood that data indicative of a remainder may be generated with or without the use of actual division.

A CRC code is one category of remainder-based codes. As stated above, it has been recognized that aspects of the present invention are not limited to CRC codes, but rather may be applied to remainder based codes and operations in general, where a quotient is not absolutely required. Another category of remainder based operations is employed in cryptographic, systems. In some applications of cryptographic systems, large keys are manipulated (mod n). One or more aspects of the present invention have applicability to remainder-based codes and operations in general, including but not limited to, CRC codes and cryptographic systems. Further, one or more particular embodiments may be used to greatly reduce the time needed to manipulate large keys that may be associated with cryptographic systems.

Some examples of embodiments for generating CRC codes having a specified relation to data indicative of a CRC remainder include, but are not limited to:

(1) reflected data implementations;
(2) reversed data implementations;
(3) reversed polynomial implementations;
(4) initialized value implementations;
(5) reversed final value implementations;
(6) XOR'ed initial value implementations;
(7) XOR'ed final value implementations;

Further, the specified relation may be predetermined and fixed, but is not limited to such. For example, one specified relation may be uniformly applied to all blocks of data, or a specified relation used for some Meeks of data or some portions may be different than that used for other blocks of data D or ether portions.

As used herein, the term a CRC code for data includes, but is not limited to:
(1) a code having a specified relation to data indicative of a CRC remainder for the data; and
(2) a code having a specified relation to data indicative of a CRC remainder for data having a specified relation to the data.

The CRC code may be generated in any manner, including but not limited to, serial implementation, parallel implementation, and any combination thereof. The CRC code may be of any type and in any form. For example, in one embodiment the data indicative of a CRC code comprises signals retained in memory that coexist with one another. In another embodiment, the data indicative of a CRC code comprises signals that are not retained and/or do not coexist.

A PCRC code may or may not be associated with one of the portions. If a PCRC code is associated with one of the portions, then it is generated in response to that portion but need not be a PCRC code for that portion. As used herein the term a PCRC code for a portion includes, but is not limited to:
(1) code having a specified relation to data indicative of a CRC remainder for a portion;
(2) a code having a specified relation to data indicative of a CRC remainder for data to having a specified relation to a portion.

The partitioner 242, the preliminary CRC code generator 246 and the CRC code synthesizer 252 may be programmable or non-programmable, general purpose or special purpose, dedicated or non-dedicated, distributed or non-distributed, shared or not shared, and/or any combination thereof. The partitioner 242, the preliminary CRC code generator 246 and the CRC code synthesizer 252 may each comprise hardware, software, firmware, hardwired circuits and/or any combination thereof. The partitioner 242, the preliminary CRC code generator 246 and the CRC code synthesizer 252 may or may not include one or a plurality of subroutines, or modules, each of which includes one or a plurality of instructions to be executed by the data processor 240, and may or may not perform tasks in addition to those associated with generating a CRC code.

Figure 6:
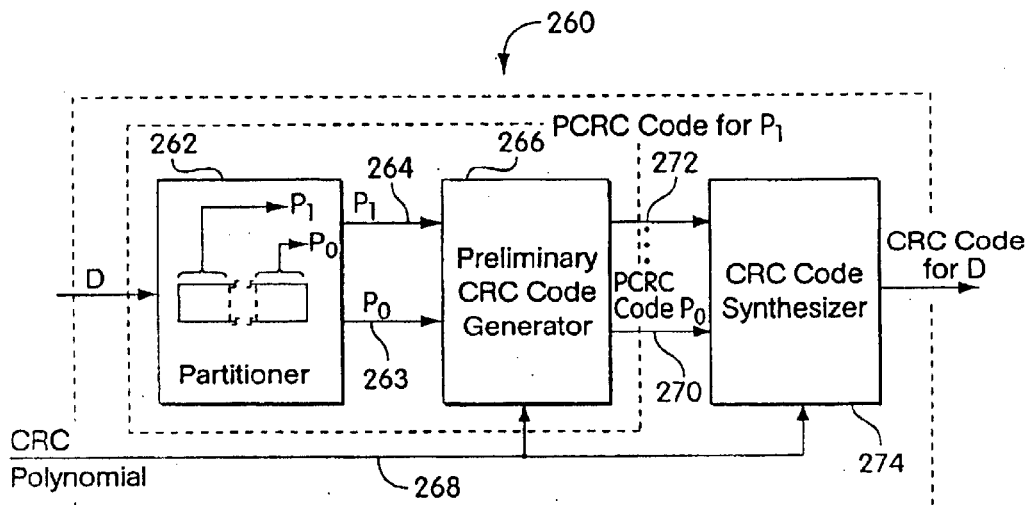
FIG. 6 is a schematic block diagram of one embodiment of the system of FIG. 5A.

FIG. 6 illustrates another embodiment 260 of the data processor 240 of FIG. 5A. This embodiment of the data processor includes a partitioner 262 that receives a block of data D and partitions the block of data D into exactly two portions, i.e., a first portion $P_0$ and a second portion $P_1$. The first portion $P_0$ and the second portion $P_1$ are supplied on lines 263, 264 to a preliminary CRC code generator 266, which further receives data indicative of a CRC polynomial on a line 268 and generates two PCRC codes. One of the PCRC codes, referred to as PCRC code for $P_0$, is associated with the first portion $P_0$ of the data block. The other of the PCRC codes, referred to as PCRC code for $P_1$, is associated with the second portion $P_1$ of the data block. The data indicative of the PCRC code associated with the first portion $P_0$ and the data indicative of the PCRC code associated with the second portion $P_1$ are supplied on lines 270, 272 to a CRC synthesizer 274 that combines the PCRC codes for the two portions, to generate data indicative of a CRC code for the data D.

Figure 7:
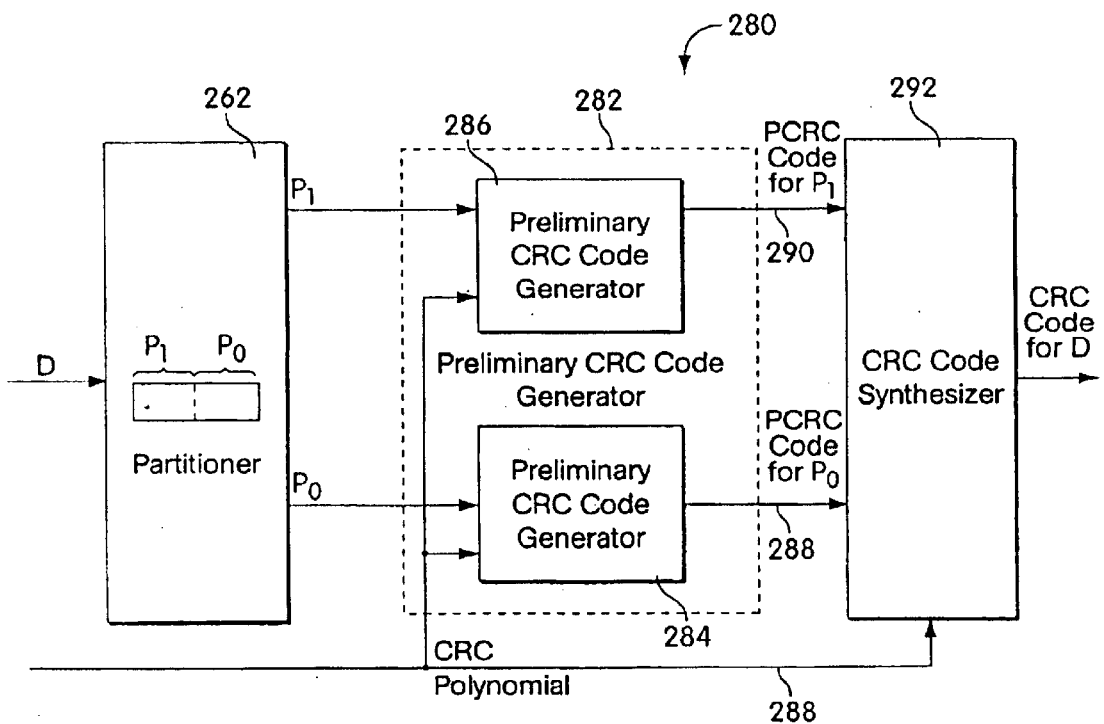
FIG. 7 is a schematic block diagram of one embodiment of the system of FIG. 6.

FIG. 7 shows one illustrative embodiment 280 of the data processor 260 of FIG. 6A. In this embodiment; a preliminary CRC code generator 280 comprises a first preliminary CRC code generator 284 and a second preliminary CRC code generator 286. The first one of the preliminary CRC code generators 284 receives data indicative of the first portion $P_0$ and data representing a CRC polynomial on a line 288, and generates a PCRC code for the first portion $P_0$. The second one of the CRC generators 286 receives data indicative of the second portion $P_1$ and data representing the CRC polynomial on a line 288, and generates a PCRC code for the second portion $P_1$. The two preliminary CRC code generators 284, 286 may or may not be identical, and may or may no operate in parallel with one another.

The data indicative of the PCRC code associated with the first portion $P_0$, CRC $P_0$, and the data indicative of the PCRC code associated with the second portion $P_1$, CRC $P_1$, are supplied on lines 288, 290 respectively, to a CRC synthesizer 292, which combines the PCRC codes for the portions to generate the data indicative of a CRC code for the block of data D.

Figure 8A:
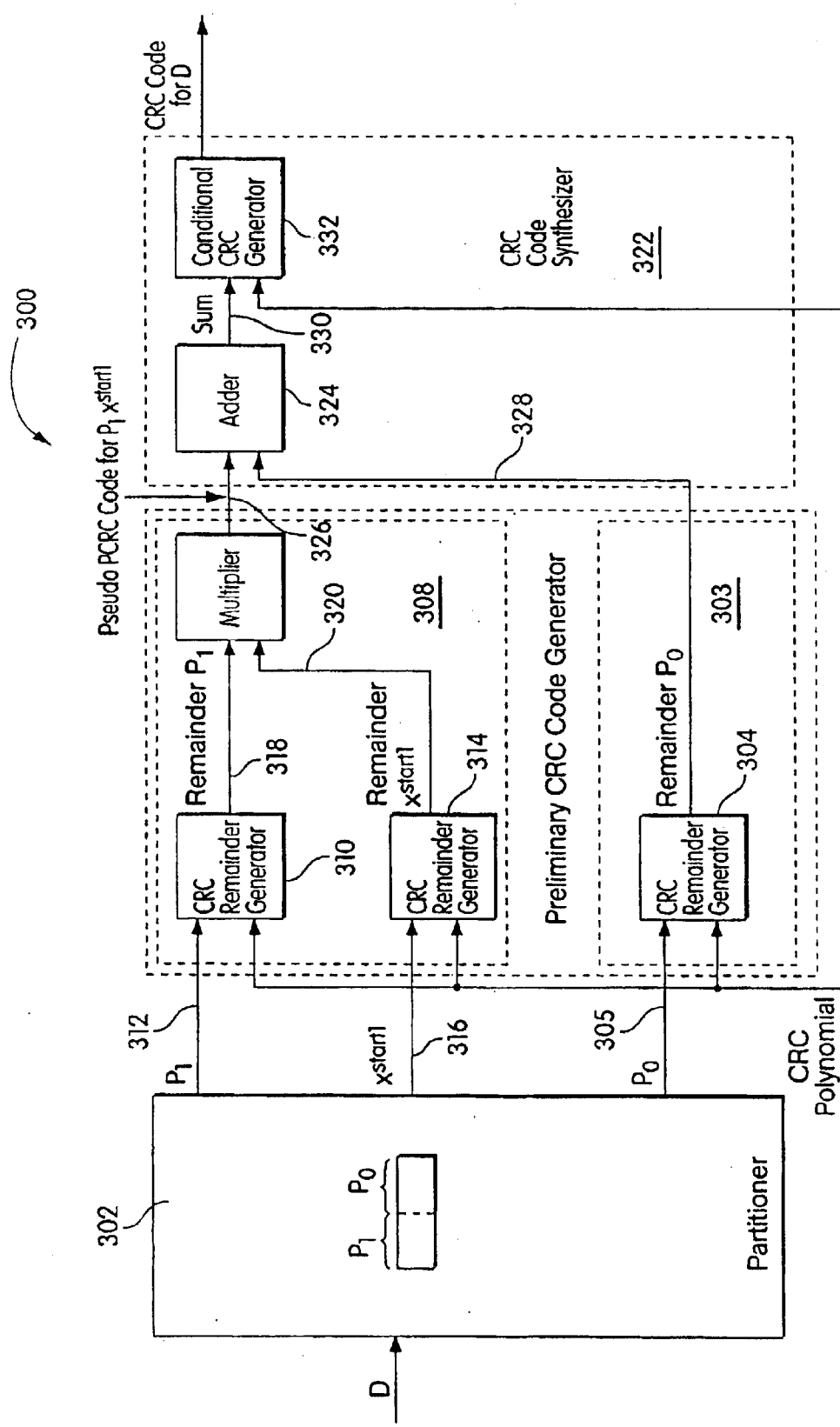
FIG. 8A is a schematic block diagram of one embodiment of the data processor of FIG. 6.
Figure 8B:
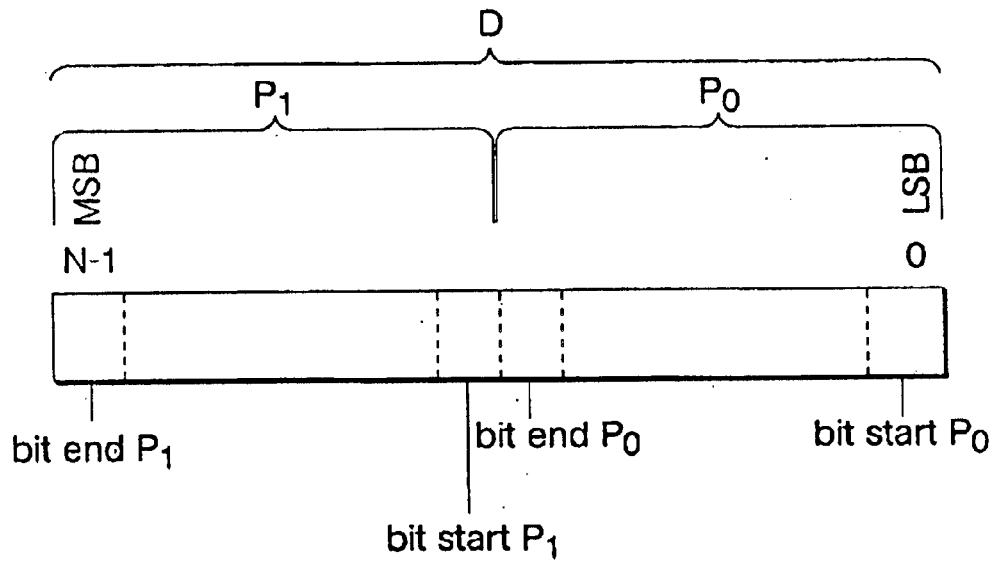
FIG. 8B illustrates characteristics of one embodiment of the partitioner of the data processor of FIG. 8A

FIG. 8A shows one embodiment 300 of the data processor 280 of FIG. 7, and which may for example be used to carry out the operations shown in the example of FIGS. 4A–4F. In this embodiment 300, the data processor includes a partitioner 302 that receives a block of data D representative of a bit string. Referring to FIG. 3B, the bit string has N bits including an LSB, bit 0, and an MSB, bit N–1. The partitioner 302 partitions the bit string into exactly two portions, portion $P_0$ and portion $P_1$. Portion $P_0$ comprises bit start $P_0$ (i.e., the LSB, bit 0) of the data string through bit end $P_0$ of the data string. Portion $P_1$ comprises bit start $P_1$ of the data string through bit end $P_{k-1}$ (i.e., the MSB, bit N–1) of the data string.

Figure 8C:
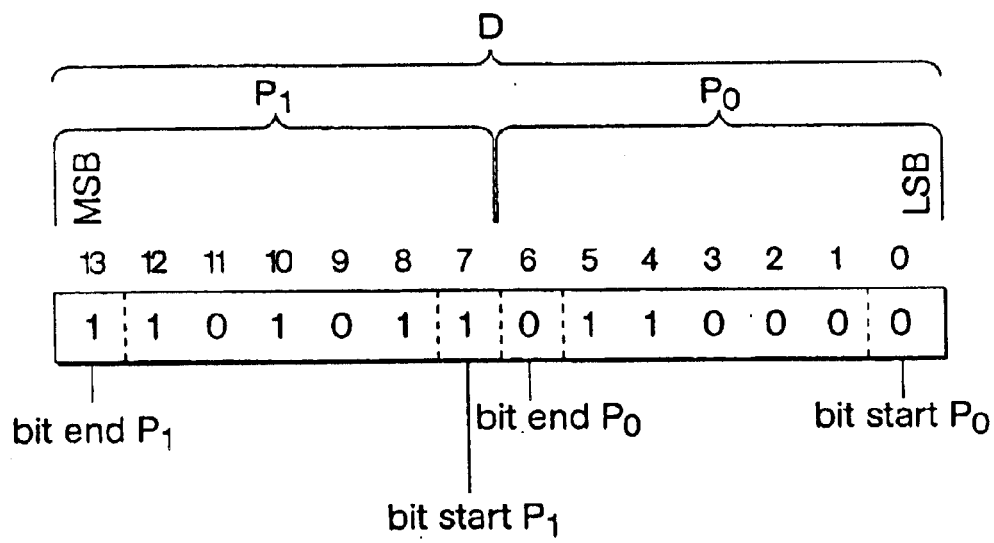
FIG. 8C illustrates the operation of one embodiment of the partitioner of FIG. 8B.

FIG. 8C shows an example of the operation of the partitioner 302. In this example, the block of data D is the bit string "11010110110000" of FIG. 1C. As stated above with respect to FIG. 1C, the block of data D can be viewed as representing coefficients of a polynomial that thus has the following terms: $x^{13}+X^{12}+x^{10}+x^8+x^7+x^5+x^4$.

The partitioner 302 partitions the bit string into two portions. The first portion $P_0$ comprises a bit sequence "0110000", i.e., bit zero through bit six of the block of data D. The second portion $P_1$ comprises a bit sequence "1101011", i.e., bit seven through bit thirteen of the block of data D. Thus, in this example, start $P_0$ is equal to zero. End $P_0$ is equal to six. Start $P_1$ is equal to seven. End $P_1$ is equal to thirteen.

The portions $P_0$ and $P_1$ can themselves be viewed as representing coefficients of polynomials. In this view, the first portion $P_0$, i.e., the bit sequence "0110000", represents a polynomial having terms: $x^5+x^4$. The second portion $P_1$, i.e. the bit sequence "1101011", can be viewed as representing coefficients of a polynomial having terms: $(x^6+x^5+x^3+x+1)$.

In addition, because the block of data D can be viewed as representing a polynomial, the partitioner 302 can be viewed as partitioning the polynomial into two portions. In this view, the first portion $P_0$, i.e., the bit sequence "0110000", represents the terms $x^5+x^4$. The second portion $P_1$, i.e. the bit sequence "1101011", represents the terms $x^{13}+x^{12}+x^{10}+x^8+x^7$. The latter terms can be factored as $(x^6+x^5+x^3+x+1)*x^7$, and can be expressed as $(x^6+x^5+x^3+x+1)*x^{startj}$, where $start_j$ is equal to seven. Note that the term $x^7$ could be represented by a bit string "10000000".

A first one of the preliminary CRC code generators 303 includes a CRC remainder generator 304 that receives data indicative of the first portion $P_0$ on a line 305 and data indicative of the CRC polynomial on a line 306 and generates data indicative of a CRC remainder for portion $P_0$.

A second one of the preliminary CRC code generators 308 has a first CRC remainder generator 310 that receives the data indicative of the second portion $P_1$ on a line 312 and data indicative of the CRC polynomial on the line 306, and generates data indicative of a CRC remainder for the second portion $P_1$. A second CRC code generator 314 receives data indicative of a polynomial $x^{start1}$ on a line 316 and data on the line 306 indicative of the CRC polynomial, and generates data indicative of a CRC remainder for the polynomial $x^{start1}$. The data indicative of a CRC remainder for the second portion $P_1$ and the data indicative of a CRC remainder for polynomial $x^{start1}$ are supplied on lines 318, 320 to a multiplier. The multiplier generates data indicative of a product of the two CRC remainders.

The second one of the CRC code generators includes a CRC remainder generator that receives data indicative of the first portion $P_0$ and data indicative of the CRC polynomial and generates data indicative of a CRC remainder for portion $P_0$.

A CRC synthesizer 322 has an adder 324 that receives the multiplier output data indicative of the product of the two CRC remainders on a line 326, and the data indicative of a CRC remainder for portion $P_0$ on a line 328. The adder 324 generates data indicative of a sum at line 330, which is supplied to a conditional CRC remainder generator 332. If a polynomial represented by the data indicative of the sum is greater than or equal to the CRC polynomial, then the conditional CRC remainder generator 332 performs a further reduction by dividing the polynomial sum by the CRC polynomial to obtain a remainder which may be used to generate the CRC code for the data D. If a polynomial represented by the data indicative of the sum is not greater than or equal to the CRC polynomial, then the data indicative of the sum is already the remainder, and the conditional CRC remainder generator 332 does not perform a further reduction.

Each of the CRC remainder generators 304, 310, 314 may be any type of CRC remainder generator, including but not limited to a serial type or a parallel type, table-driven or non-table driven, a bit-by-bit or a multi-bit (e.g., a byte) type, and/or any combination thereof. One or more of the CRC remainder generators 304, 310, 314 may or may not employ a linear feedback shift register (LFSR). Any particular CRC remainder generator need not be the same as any of the other CRC remainder generators.

In one embodiment, data indicative of a CRC remainder for polynomial $x^{start1}$ is stored in the CRC remainder generator 314. If the data indicative of a CRC remainder for polynomial $x^{start1}$ is stored in the CRC remainder generator 314, then the CRC remainder generator 314 may generate the remainder for polynomial $x^{start1}$ by accessing the stored data, rather than by actually computing the remainder for polynomial $x^{start1}$.

Figure 9:
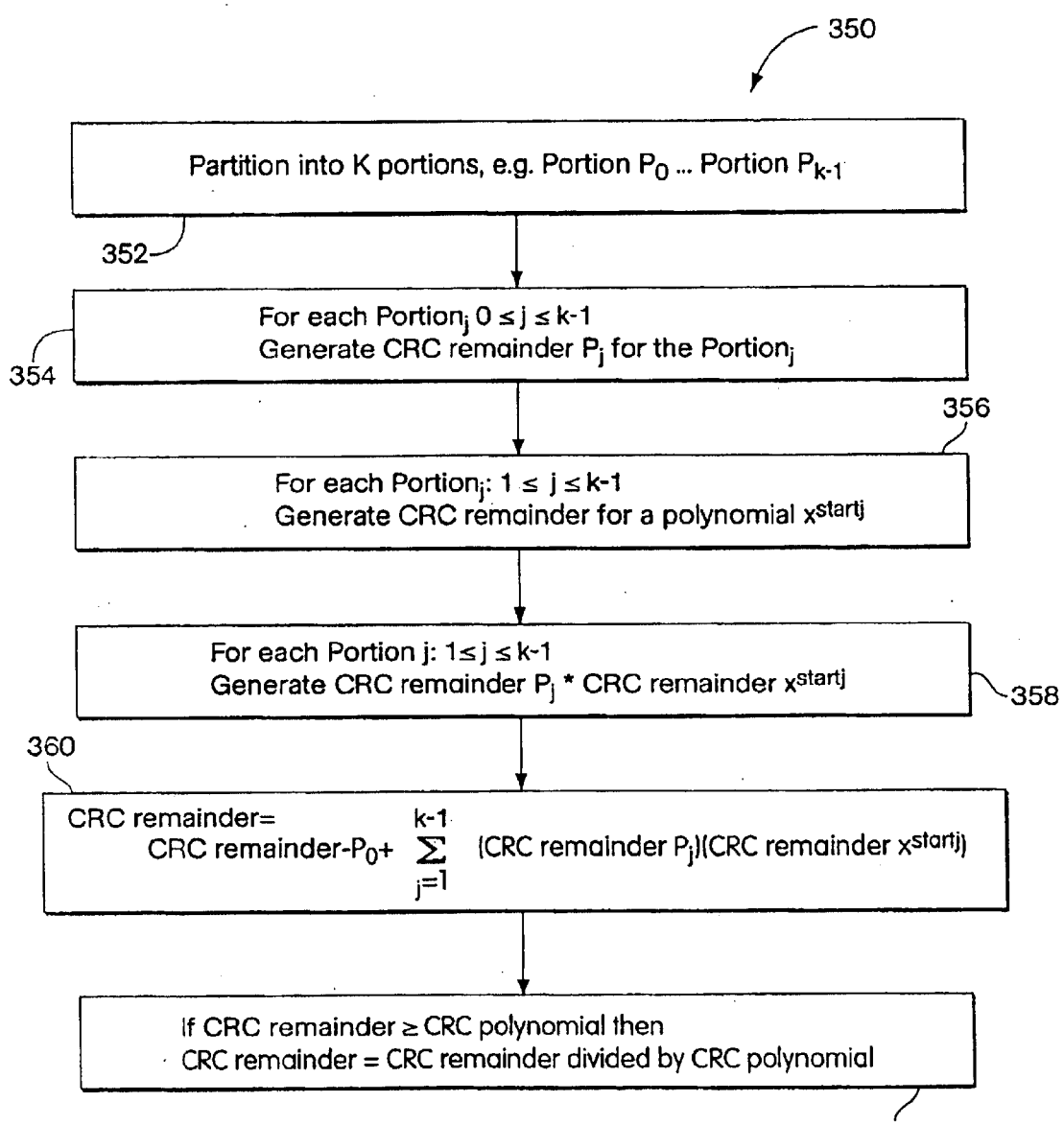
FIG. 9 is a flowchart diagram of one embodiment of a data processor that generates k potions to generate a CRC code for a block of data D.

FIG. 9 is a flowchart diagram 350 showing steps carried out by one embodiment of a data processor that generates k portions to generate a CRC code for a block of data D. A block of data is partitioned into k portions at a step 352 or block, the k portions being referred to herein as portion $P_1$ through $P_{k-1}$. At a step 354, a CRC remainder is generated for each of the k portions, the CRC remainder for the $j^{th}$ portion referred to herein as CRC remainder $P_j$. At a step 356, a CRC remainder is generated for each of k-1 polynomials, the $j^{th}$ polynomial being referred to herein as $x^{startj}$, the CRC remainder for the $j^{th}$ polynomial being referred to herein as CRC remainder $x^{startj}$. At a step 358, a product is generated for each of portions $P_1$ through portion $P_{k-1}$, according to the equation (CRC remainder $P_j$)+(CRC remainder $x^{startj}$). At a step 360, a CRC remainder for the data block is generated by summing the CRC remainder $P_0$ and with the k-1 products generated at the step 358. A step 362 determines whether the CRC remainder for the data block is greater than or equal to the CRC polynomial, and if so, the CRC remainder for the data block is further reduced by dividing it by the CRC polynomial.

In some embodiments, one or more PCRC codes may be generated in parallel with one another, for example to reduce the elapsed time needed to compute the CRC code for the block of data D. Consider for example, one embodiment where the block of data D is partitioned into two approximately equal size portions (e.g., as shown in FIG. 4A) and remainders for each are generated in parallel with one another. The elapsed time required to generate the two remainders is approximately one half the time required to generate the remainder without partitioning (FIG. 2A). A multiply operation(e.g., FIG. 4D), an addition operation (e.g., FIG. 4F), and if appropriate, a reduction operation (e.g., if the sum is greater than or equal to the CRC polynomial, see discussion above with respect to FIG. 4F) may be performed, resulting in a remainder for the block of data D (e.g., FIG. 4F). In regard to such embodiment, the time required to generate a remainder for an N-bit data block may be approximated as:

$$t_{crc2}(n) = t_{crc}(n/2) + m \qquad \text{eq. 18}$$

where $t_{crc}(n)$=the amount of time required to generate a remainder for an N-bit block of data without partitioning the block of data, and m=the amount of time required for a multiply operation, an addition operation, and if needed, a further reduction operation.

It should however, be recognized that there is no requirement that PCRC codes be generated in parallel with one another or that the time required to generate a CRC code be expressed by eq. 18.

In some embodiments, the data processor comprises a plurality of processor units, which may or may not operate in parallel with one another and may or may not be substantially identical to one another. A plurality of processor units may or may not be integrated into a single package. Examples of processors with processor units that are integrated into a single package and capable of operating in parallel with one another include but are not limited to TigerSHARC and Hammerhead processors available from Analog Devices of Norwood, Mass.; C6X processors available from Texas Instruments, Inc. of Dallas, Tex.; and Power PC processors available from Motorola of Schaumburg, Ill. The processor may be, but does not need to be, of a type that employs very long instruction words (VLIW).

Figure 10A:
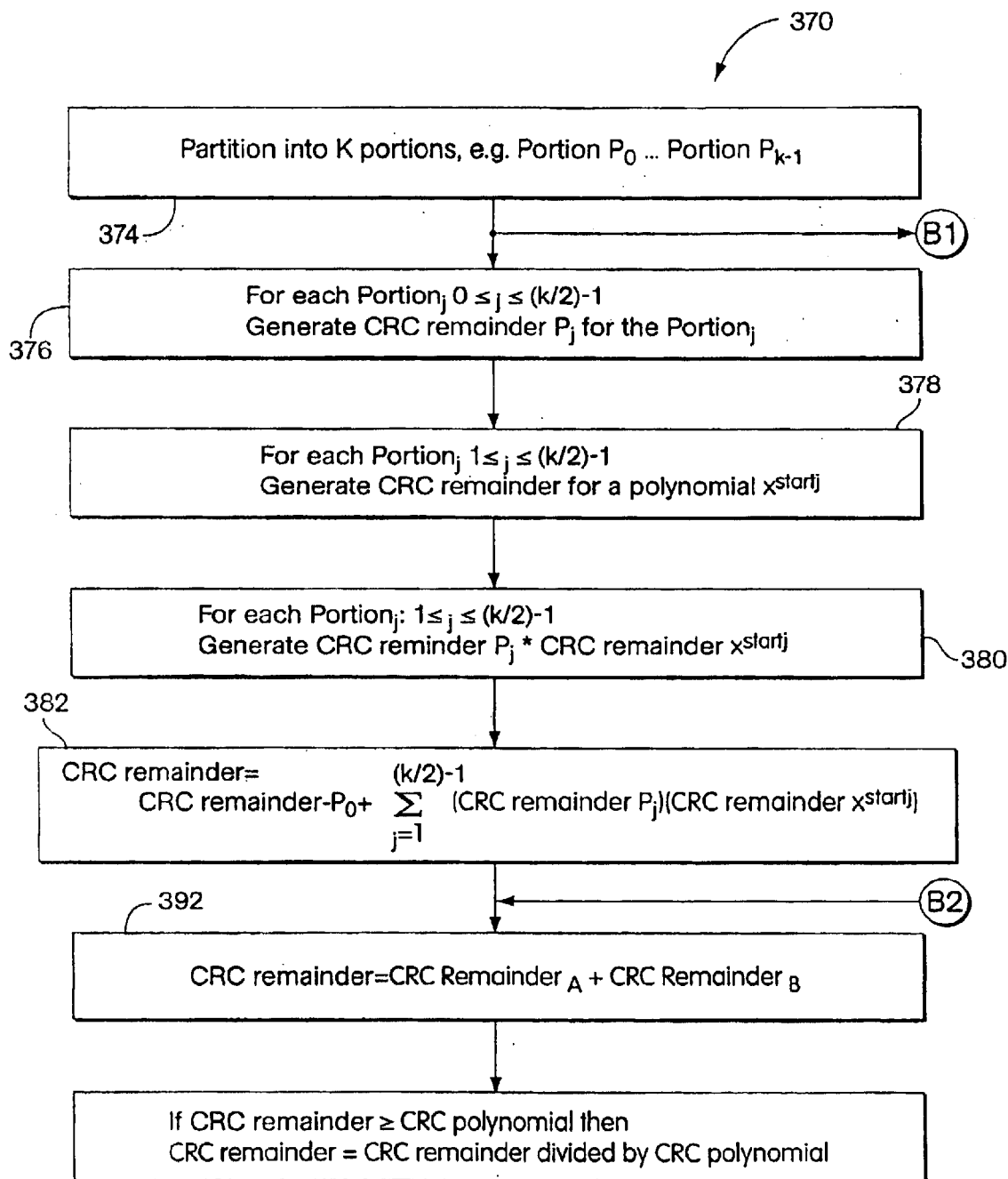
FIGS. 10A and 10B are flowchart diagrams showing steps carried out in one embodiment that comprises two processors.
Figure 10B:
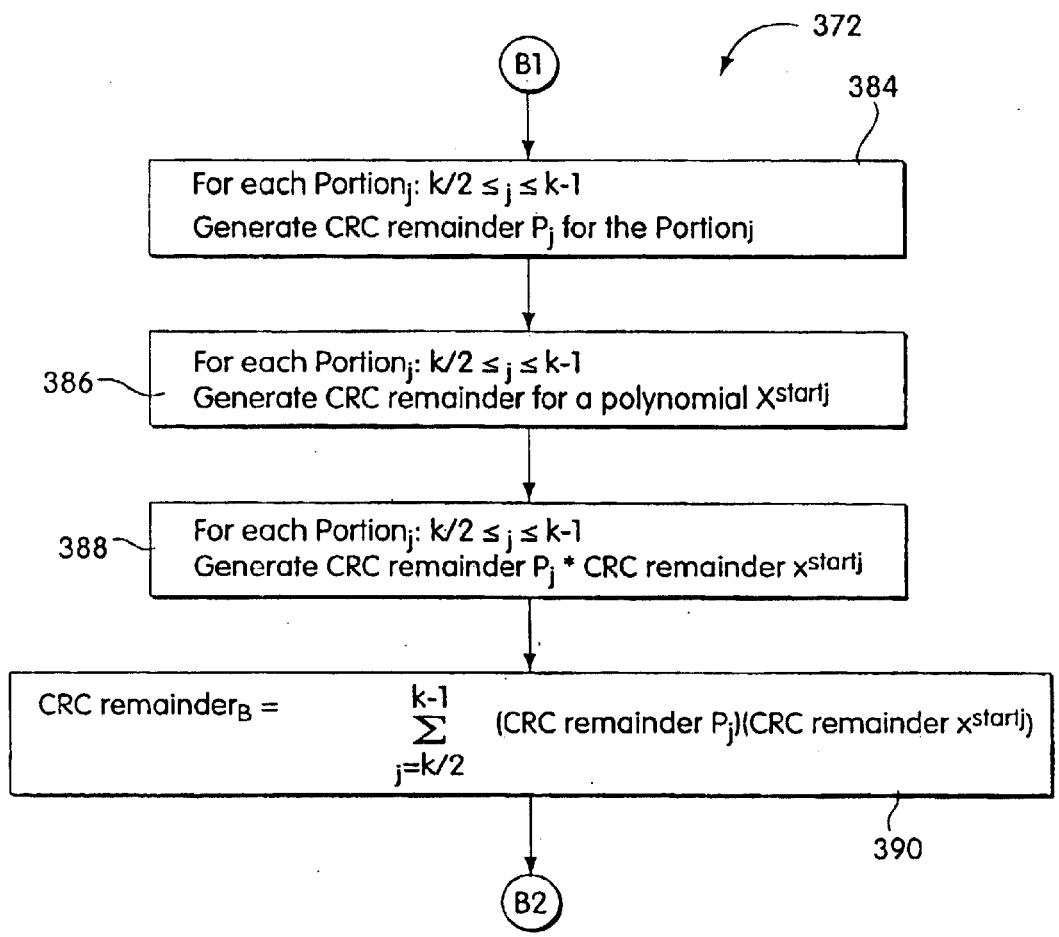

FIGS. 10A and 10B are flowchart diagrams 370, 372 showing steps carried out in one embodiment that comprises two processors, referred to herein as processor A and processor B. The flowchart diagram 370 of FIG. 10A shows the steps carried out by processor A. The flowchart diagram 372 of FIG. 10B shows the steps carried out by processor B. Referring now to FIG. 10A, a block of data is partitioned into k portions at a step 374, the k portions being referred to herein as portion $P_0$ through $P_{k-1}$. In this embodiment, processor A (FIG. 10A) is responsive to portions $P_0$ through $P_{(k/2)-1}$, and processor B (FIG. 10A) is responsive to portions $P_0$ through $P_{(k/2)-1}$. At a step 376, processor A generates a CRC remainder for each of portions $P_0$ through $P_{(k/2)-1}$, the CRC remainder for the $j^{th}$ portion referred to herein as CRC remainder $P_j$. At a step 378, processor A generates a CRC remainder for each of (k/2)-1 polynomials, the $j^{th}$ polynomial being referred to herein as $x^{startj}$, the CRC remainder for the $j^{th}$ polynomial being referred to herein as CRC remainder $x^{startj}$. At a step 380, processor A generates a product for each of portions $P_1$ through portion $P_{(k/2)-1}$, according to the equation (CRC remainder $P_j$)*(CRC remainder $x^{startj}$). At a step 382, processor A generates a first part of a CRC remainder for the data block, referred to herein as CRC remainder$_A$, by summing the CRC remainder $P_0$ and the products generated at the step 380.

Referring now to FIG. 10B, at a step 384, processor B generates a CRC for each of portions $P_{k/2}$ through $P_{k-1}$, the CRC remainder for the $j^{th}$ portion referred to herein as CRC remainder $P_j$. At a step 386, processor B generates a CRC remainder for each of k/2 polynomials, the $j^{th}$ polynomial being referred to herein as $x^{startj}$, the CRC remainder for the $j^{th}$ polynomial being referred to herein as CRC remainder $x^{startj}$. At a step 388, processor B generates a product for each of portions $P_{k/2}$ through portion $P_{k-1}$, according to the equation (CRC remainder $P_j$)*(CRC remainder $x^{startj}$). At a step 390, processor B generates a second part of a CRC remainder for the data block, referred to herein as CRC remainder$_B$, by summing the products generated at the step 388.

Referring again to FIG. 10A, at a step 392, a CRC remainder for the data block is generated by summing first part of a CRC remainder for the data block, CRC remainder$_A$, and the second part of a CRC remainder for the data block, CRC remainder$_B$. A step 394, determines whether the CRC remainder for the data block is greater than or equal to the CRC polynomial, and if so, the CRC remainder for the data block is further reduced by dividing it by the CRC polynomial.

In some embodiments, one or both of processor A and processor B have a pipelined architecture. For example, the TigerSHARC processor available from Analog Devices, Inc, of Norwood, Mass. comprises two processor units each having a pipelined architecture.

Figure 10C:
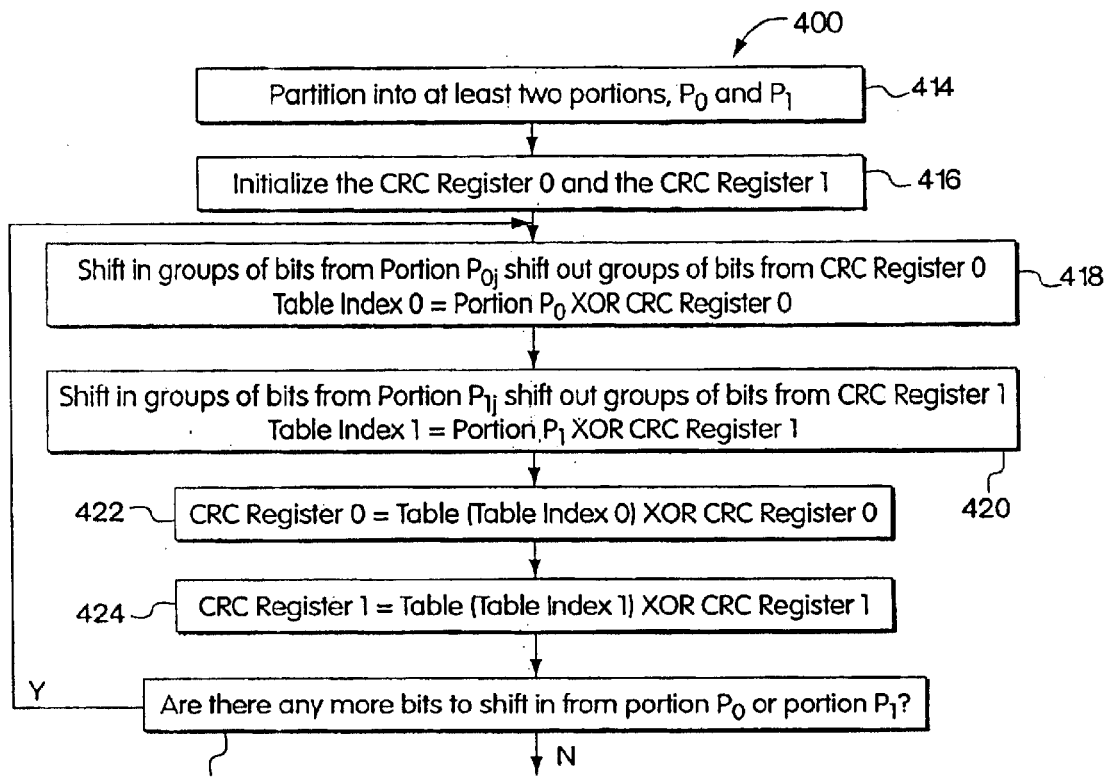
FIG. 10C is a flowchart diagram of an algorithm that may be carried out in one embodiment having a processor unit with a pipelined architecture.
Figure 10D:
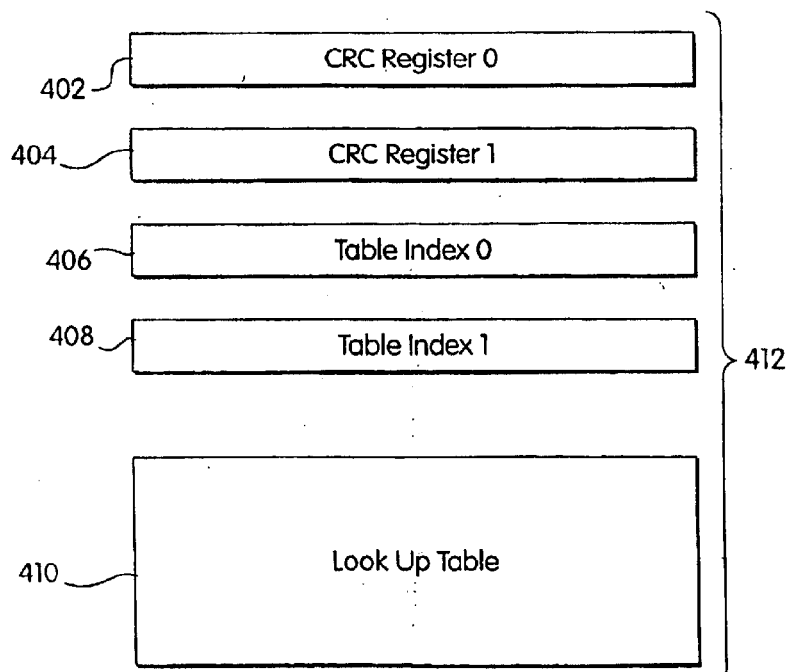
FIG. 10D is a representation of CRC register0, a CRC register1, a Table Index0 register, and a Table Index1 register that may be located within a processor with a pipelined to architecture.

In some embodiments, a processor with a pipelined architecture is used to generate PCRC codes in parallel with one another. FIG. 10C is a flowchart diagram 400 of an algorithm that may be carried out in one embodiment. The algorithm may be carried out in association with a plurality of registers a CRC register0 402, a CRC register1 404, a Table Index0 register 406, and a Table Index1 register 408 and a Look Up Table 410(each shown in FIG. 10D) which may be located within a pipelined architecture processor 412. At a step 414, the block of data is partitioned into at least two portions, portion $P_0$ and portion $P_1$. In this embodiment, portion $P_0$ and portion $P_1$ have the same length as each other, as stated above the present invention does not require portions to have the same lengths as each other. At a step 416, the CRC register0 and the CRC register1 are initialized, e.g., by setting all of the bits to a logic "0" state. At a step 418, a group of bits are shifted out of the CRC register0 and a group of bits are shifted in from portion $P_0$. A value of a register referred to as Table Index0 is set equal to a result of XOR'ing the group of bits shifted in from portion $P_0$ with the group of bits shifted out from the CRC register0. At a step 420, a group of bits are shifted out of the CRC register1 and a group of bits are shifted in from portion $P_1$. A value of a register referred to as Table Index1 is set equal to a result of XOR'ing the group of bits shifted in from portion $P_1$ with the group of bits shifted out from the CRC register1 . At a step 422, the CRC register0 is set equal to a result of XOR'ing the CRC register0 with the data in the Look Up Table at the location identified by the value of the Table Index0 register. At a step 424, the CRC register1 is set equal to a result of XOR'ing the CRC register1 with the data in the Look Up Table at the location identified by the value of the Table Index1 register. At a step 426, a determination is made as to whether there are any more bits to shift in from $P_0$ and portion $P_1$. If there are more bits to shift in, then execution returns to the step. If there are no more bits to shift in, then the algorithm ends, wherein the contents of the CRC register0 indicates the remainder for the portion $P_0$ and the contents of the CRC register1 indicates the remainder for portion $P_1$.

Figure 2H:
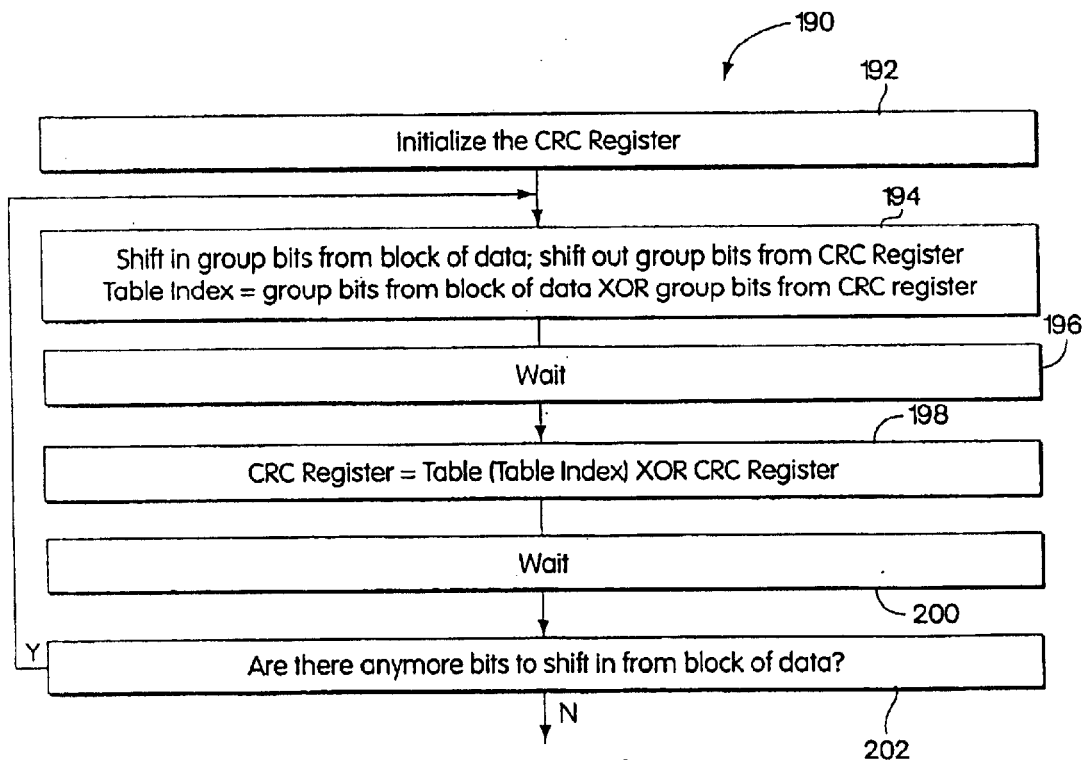
FIG. 2H is a flowchart diagram of another algorithm for carrying out a table driven implementation.

Although the algorithm of FIG. 10C has zero WAIT steps, the present invention is not limited to such. For example, other embodiments for use with a pipelined architecture may have more than zero WAIT steps. However, as to the embodiment of FIG. 10C and in regard to computation of the CRC code for the block of data made up of portion $P_0$ and the portion $P_1$, this embodiment more effectively utilizes the pipelined architecture of the processor than is possible with the algorithm of FIG. 2H. As a consequence, for a given processor, block size and CRC polynomial, the elapsed time needed to generate the CRC for a block of data in this embodiment is less than that needed to generate the CRC for the block of data using the prior art algorithm shown in FIG. 2H.

In some embodiments, the algorithm of FIG. 10C, or one or more other algorithms that use a pipeline architecture to generate one or more PCRC codes in parallel with one another, with or without WAIT steps, are used in association with a data processor that comprises a plurality of processor units, where one or more of the processing units comprises a pipelined architecture. For example one embodiment uses the TigerSHARC processor available from Analog Devices, Inc, of Norwood, Mass., which comprises two processor units each having a pipelined architecture. In such embodiment, one or more other algorithms that use a pipeline architecture to generate one or more PCRC codes in parallel with one another may be carried out on one or both of the processing units.

In some embodiments, the data processor 240 (FIG. 5A) has an architecture that may be viewed as hierarchical or recursive. For example, the PCRC Code that is to be generated by the Preliminary CRC code generator 286 (FIG. 7) may itself be treated as a CRC code for data, wherein the portion $P_1$ is the data. Thus the CRC code for the portion $P_1$ may be generated based on the same principals set forth herein for generating the CRC code for the data D. That is, the CRC code for the portion $P_1$ may itself be generated by first generating a plurality of preliminary CRC codes in response to the portion $P_1$, and then generating the CRC code for the portion $P_1$ in response to the plurality of preliminary CRC codes. Thus, for example, in some embodiments the preliminary CRC code generator 286 may comprise a data processor in accordance with the present invention.

Figure 11:
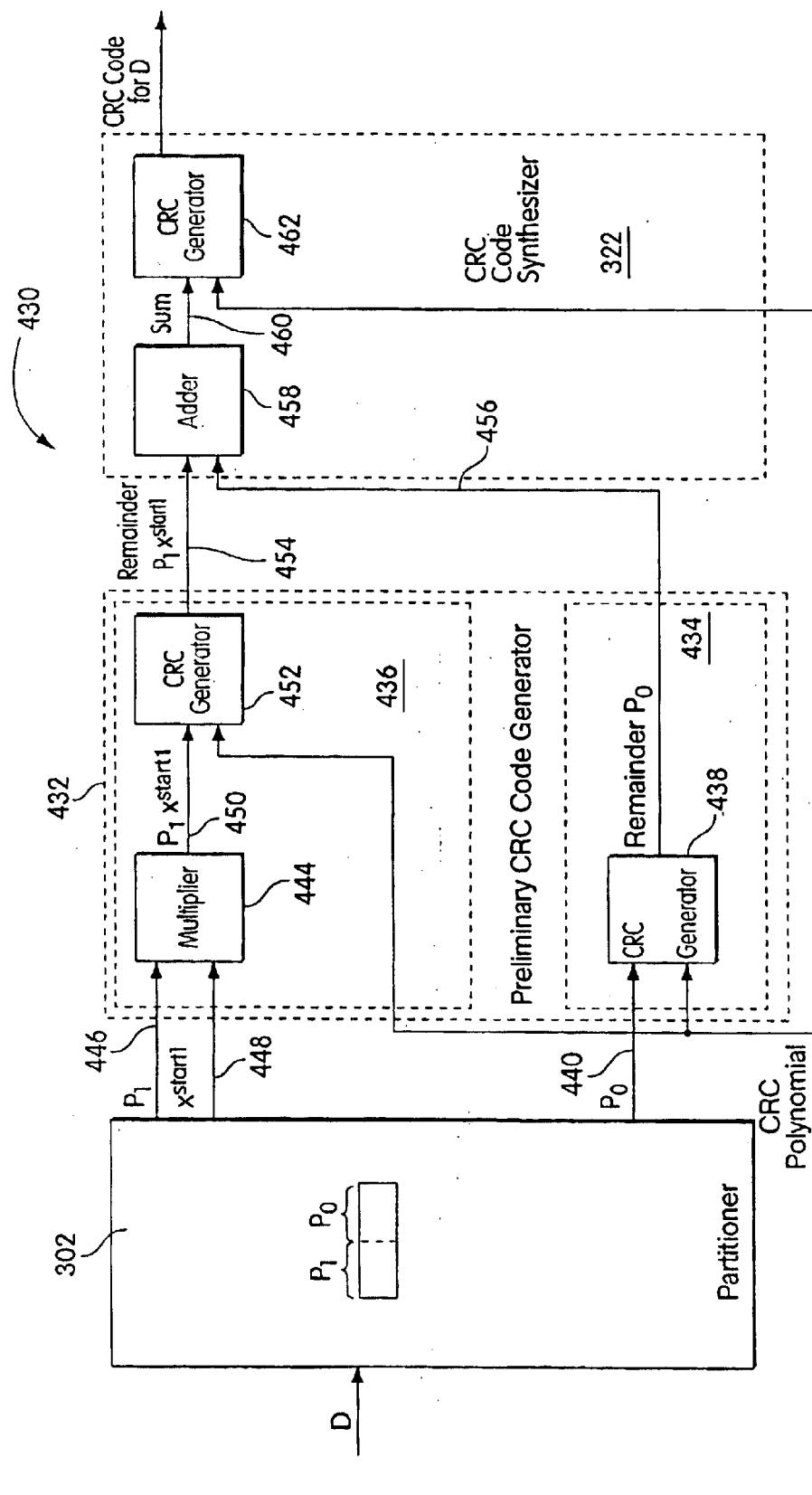
FIG. 11 is a schematic block diagram of another embodiment of the data processor of FIG. 6.

FIG. 11 is a schematic block diagram of another embodiment 430 of the data processor 280 of FIG. 7. The data processor 430 of FIG. 11 includes the partitioner 302 (see also FIG. 8A), a preliminary CRC code generator 432 and the CRC synthesizer 322 (see also FIG. 8A). The partitioner 302 and the CRC synthesizer 322 are the same as the partitioner 302 and the CRC synthesizer 322, respectively, of the data processor of FIG. 8A. The preliminary CRC code generator 432 has two preliminary CRC code generators 434, 436, as in the preliminary code generator of the data processor of FIG. 8A, but the second preliminary CRC code generator 436 is different than the second preliminary CRC code generator 308 of the data processor of FIG. 8A.

The first one of the preliminary CRC code generators 434 includes a CRC remainder generator 438 that receives the data indicative of the first portion $P_0$ at line 440 and the data indicative of the CRC polynomial at line 442. The CRC remainder generator 438 generates data indicative of a CRC remainder for portion $P_0$.

In this embodiment 430, the second one of the preliminary CRC code generators 436 includes a multiplier 444 which has a first input that receives data indicative of the second portion $P_1$ at line 446 and a second input that receives data indicative of the polynomial $x^{start1}$ at line 448. The multiplier generates data indicative of a product, $P_1 * x^{start1}$, which is supplied on a line 450 to an input of a CRC remainder generator 452. The CRC remainder 452 generator further receives data indicative of a CRC polynomial on the line 442 and generates data indicative of a CRC remainder for the product $P_1 * x^{start1}$. The data indicative of a CRC remainder for the product $P_1 * x^{start1}$ is considered associated with the portion $P_1$.

The data indicative of a CRC remainder for the product $P_1 * x^{start1}$ and the data indicative of a CRC remainder for portion $P_0$ are input on lines 454, 456 respectively, to an adder 458 that generates a sum thereof. The sum is input on a line 460 to a conditional CRC remainder generator 462, which further receives data indicative of the CRC polynomial on the line 442. If a polynomial represented by the data indicative of the sum is greater than or equal to the CRC polynomial, then the conditional CRC remainder generator 462 performs a further reduction by dividing the polynomial sum by the CRC polynomial to obtain a remainder which may be used to generate the CRC code for the data D. If a polynomial represented by the data indicative of the sum is not greater than or equal to the CRC polynomial, then the data indicative of the sum is already the remainder, and the conditional CRC remainder generator 462 does not perform a further reduction.

Figure 12:
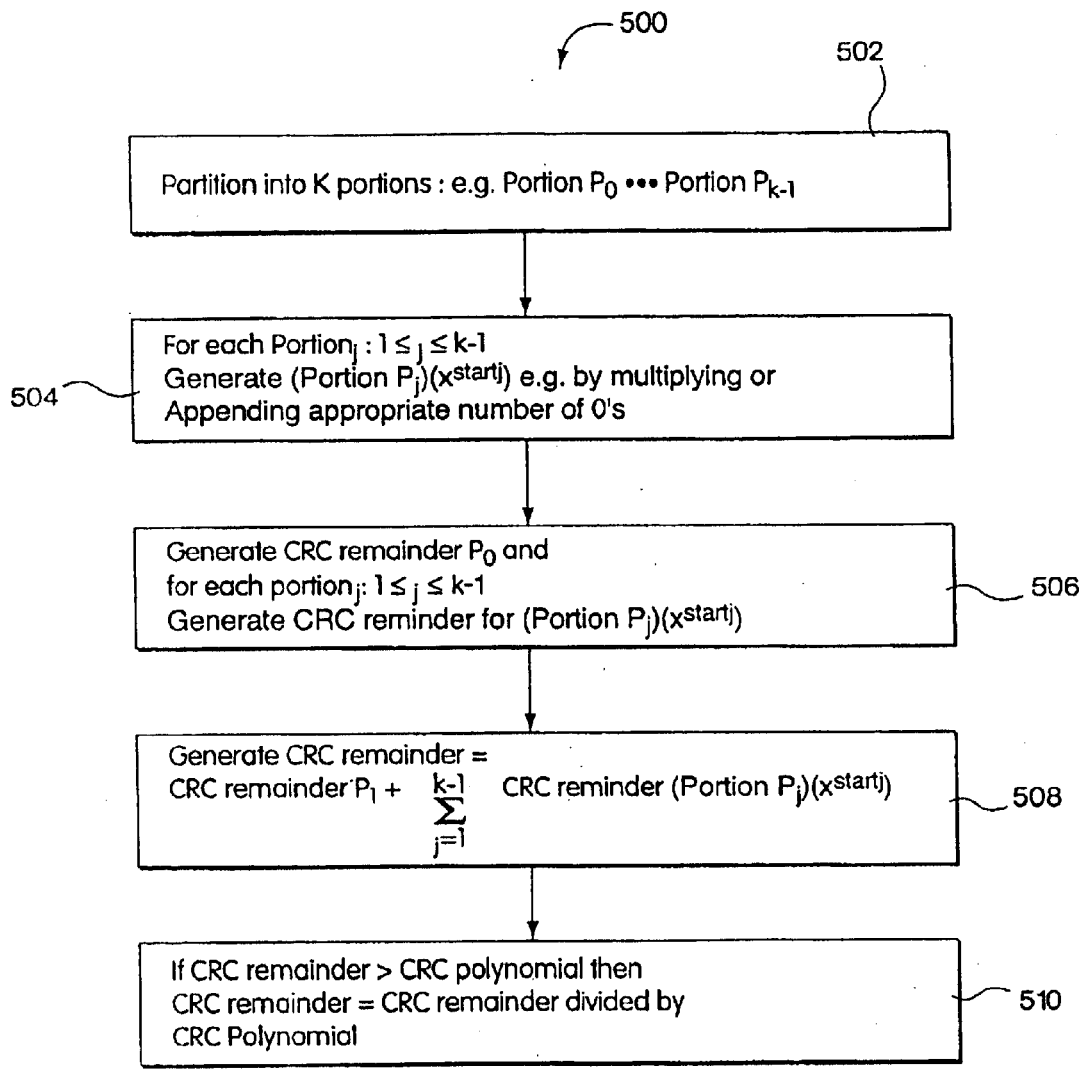
FIG. 12 is a flowchart diagram of one embodiment of a data processor that generates k potions to generate a CRC code for a block of data D.

FIG. 12 is a flowchart diagram 500 showing steps carried out by one embodiment of a data processor that generates k portions to generate a CRC code for a block of data D. A block of data is partitioned into k portions at a step 502, the k portions being referred to herein as portion $P_1$ through $P_{k-1}$. At a step 504, a product is generated for each of portions $P_1$ through $P_{k-1}$ according to the relation (Portion $P_j$)*($x^{startj}$). The product may be generated by multiplication, or, if appropriate, by appending an appropriate number of "0"'s. At a step 506, a CRC remainder is generated for portion $P_0$ and a CRC remainder is generated for each of the k−1 products generated in the step 504, the k−1 remainders being referred to herein as CRC remainder ((portion $P_j$)*($x^{startj}$)). At a step 508 a CRC remainder for the data block is generated as a sum of all of the CRC remainders generated at the step, i.e. a summation of the CRC remainder $P_0$ and the k−1 remainders referred to as CRC remainder (portion $P_j$)+($x^{startj}$).

A step 510 determines whether the CRC remainder for the data block is greater than or equal to the CRC polynomial, and if so, the CRC remainder for the data block is further reduced by dividing it by the CRC polynomial.

The present invention is not limited to the CRC algorithms and polynomials disclosed above. There is no intended limit to the types of CRC algorithms and polynomials that may be used. Furthermore, as stated above, it has been recognized that aspects of the present invention are not limited to CRC codes, but rather may be applied to remainder-based codes and operations in general, where a quotient is not absolutely required. CRC codes can be viewed as one category of remainder-based codes. Another category of remainder-based operations is cryptographic systems. One or more aspects of the present invention have applicability to remainder-based codes and operations in general, including, but not limited to, CRC codes and cryptographic systems.

In some embodiments that partition the block of data into portions, it may be desirable to take the size of a block into consideration when selecting the number of portions.

Although the CRC synthesizer described above synthesizes the CRC code by summing the plurality of PCRC codes the CRC synthesizer is not limited to such but rather may synthesize the CRC code in any manner with or without summing the plurality of PCRC codes.

As stated above, the method and apparatus of the present invention is not limited to use in communication transmission systems but rather may be used in any type of system including but not limited to any type of information system, e.g., transmission systems and storage systems, and/or combinations thereof.

One or more embodiments of the present invention may be employed anywhere within the information system, including but not limited to the sender, the receiver, or both sender and receiver, and for example may be used in wired interfaces (e.g., modem, Ethernet), wireless interfaces, or any combination thereof.

As further stated above, the data processor may comprise hardware, software, firmware, hardwired circuits and/or any combination thereof. If the data processor includes one or more computer programs, the one or more computer programs may be implemented as a computer program product tangibly embodied in a machine-readable storage device for execution by a computer. Further, a data processor is not limited to a particular computer platform, particular processor, or a particular programming language. Computer programming languages may include but are not limited to procedural programming languages, object oriented programming languages, and combinations thereof. A general purpose computer system may or may not execute a program called an operating system, which may or may not control the execution of other computer programs and provides scheduling, debugging, input/output control, accounting, compilation, storage assignment, data management, communication control, and/or related services.

In some embodiments, the data processor comprises at least a processing unit connected to a memory system via an interconnection mechanism. A memory system may include a computer-readable and writable recording medium. The medium may or may not be non-volatile. Examples of non-volatile medium include a magnetic disk, a flash memory, and tape. A disk may be removable, known as a floppy disk, or permanent, known as a hard drive. Examples of volatile memory include but is not limited to random access memory, such as a dynamic random access memory (DRAM) or static memory (SRAM), which may or may not be of a type that uses one or more integrated circuits to store information. A variety of mechanisms are known for managing information movement between the disk and an integrated circuit memory element.

While there have been shown and described various embodiments, it will be understood by those skilled in the art that the present invention is not limited to such embodiments, which have been presented by way of example only, and that various changes and modifications may be made without departing from the spirit and scope of the invention. Accordingly, the invention is limited only by the appended claims and equivalents thereto.

What is claimed is:

1. A method implemented by a data processor for providing a CRC code for specified data that comprises N bits including an LSB bit 0, and an MSB bit N−1, the method comprising:

generating a plurality of preliminary CRC codes in response to portions of the specified data, where each of the plurality of preliminary CRC codes is generated in response to a respective one of the portions, each one of the portions comprising bits adjacent to one another in the specified data, where a jth portion has an LSB that is a bit startj of the specified data, the bit startj being positioned between the LSB and the MSB of the specified data, and generating the CRC code associated with the jth portion comprises generating data indicative of a CRC code for a polynomial $x^{startj}$, and where at least one of the plurality of preliminary CRC codes is generated at least partially concurrently with at least one other of the plurality of preliminary CRC codes; and synthesizing the CRC code for the specified data in response to the plurality of preliminary CRC codes.

2. The method of claim 1 wherein generating the CRC code associated with the jth portion comprises generating a product of a CRC code for the jth portion and the CRC code for the polynomial $x^{startj}$.

3. The method of claim 2 wherein the product is indicative of a polynomial arithmetic product of the remainder for the jth portion and the remainder for the polynomial $x^{startj}$.

4. The method of claim 1 wherein all of the bits within each portion are adjacent to one another in the specified data.

5. The method of claim 1 further comprising generating the portions in response to the specified data.

6. A method as in any of claims 1, 4 or 5 further comprising generating the portions by partitioning the specified data.

7. A method as in any of claims 1, 4 or 5 wherein the portions are not all equally sized.

8. A method as in any of claims 1, 4 or 5 wherein generating a plurality of preliminary CRC codes further comprises using an instruction pipeline that generates at least two of the plurality of preliminary CRC codes at least partially concurrently with one another.

9. A method as in any of claims 1, 4 or 5 wherein the plurality of portions do not overlap one another in the specified data.

10. A method as in any of claims 1, 4 or 5 wherein generating each one of the plurality of preliminary CRC codes comprises generating a CRC remainder for the associated one of the plurality of portions.

11. A method in any of claims 1, 4 or 5 wherein generating the CRC code for the specified data further comprises generating data indicative of a summation of the plurality of preliminary CRC codes.

12. The method of claim 11 wherein generating the CRC code for the specified data further comprises generating data indicative of a remainder for the data indicative of the summation.

13. A method as in any of claims 1, 4 or 5 there are k portions including portion 0 through portion k−1 inclusive, a jth one of the k portions having an LSB that is a bit startj of the specified data, where startj is greater than or equal to 0 and less than or equal to N−1, and wherein generating the plurality of preliminary CRC codes comprises generating, for each of portion 1 through k−1, data indicative of a CRC code for a polynomial $x^{startj}$.

14. The method of claim 13 wherein generating the preliminary CRC codes associated with portion 1 through portion k−1 comprises generating data indicative of a product of a CRC code for the associated portion and a CRC code for the polynomial $x^{startj}$.

15. The method of claim 14 wherein generating each one of the plurality of preliminary CRC codes comprises generating data indicative of a product of a remainder for the associated portion and a remainder for the polynomial $x^{startj}$.

16. The method of claim 15 wherein generating the CRC code for the specified data further comprises generating data indicative of a summation of the plurality of preliminary CRC codes.

17. The method of claim 16 wherein generating the CRC code for the specified data further comprises generating data indicative of a remainder for the data indicative of the summation.

18. The method of claim 1 wherein generating the CRC code for the specified data comprises generating data indicative of a CRC remainder for the specified data.

19. A data processor for providing a CRC code for specified data, wherein the specified data comprises N bits including an LSB bit 0 and an MSB bit N−1, the data processor comprising:

means for generating a plurality of preliminary CRC codes in response to portions of the specified data, where each portion comprises bits adjacent to one another in the specified data, including means for generating each of the plurality of preliminary CRC codes in response to a respective one of the portions and means for generating at least one of the plurality of preliminary CRC codes at least partially concurrently with at least one other of the plurality of preliminary CRC codes, wherein a jth portion has an LSB that is a bit startj of the specified data, the bit startj being positioned between the LSB and the MSB of the specified data, and the means for generating a plurality of preliminary CRC codes includes means for generating data indicative of a CRC code for a polynomial $x^{startj}$; and means for synthesizing a CRC code for the specified data, in response to the plurality of preliminary CRC codes.

20. The data processor of claim 19 further comprising means for generating the portions in response to the specified data.

21. The data processor of claim 20 wherein the means generating the portions comprises means for generating the portions such that the portions do not overlap one another.

22. The data processor of claim 20 wherein the means for generating the portions comprises means for generating the portions such that all of the bits within each portion are adjacent to one another in the specified data.

23. The data processor of claim 20 wherein the means for generating the portions comprises means for generating the portions such that the portions are not all equally sized.

24. The data processor of claim 19 wherein the means for generating at least one of the plurality of preliminary CRC codes at least partially concurrently with at least one other of the plurality of preliminary CRC codes comprises an instruction pipeline that generates at least two of the preliminary CRC codes at least partially concurrently with one another.

25. A data processor that generates a plurality of preliminary CRC codes in response to portions of specified data, each of the plurality of preliminary CRC codes being generated in response to a respective one of the portions, each one of the portions comprising bits adjacent to one another in the specified data, at least one of the plurality of preliminary CRC codes being generated at least partially concurrently with at least one other of the plurality of preliminary CRC codes, wherein the specified data comprises N bits including an LSB bit 0 and an MSB bit N−1, a jth portion has an LSB that is a bit startj of the specified data, the bit startj being positioned between the LSB and the MSB of the specified data, the data processor generates data indicative of a CRC code for a polynomial $x^{startj}$, and the data processor synthesizing a CRC code for the specified data in response to the plurality of preliminary CRC codes.

26. The data processor of claim 25 wherein the data processor generates the portions by partitioning the specified data.

27. The data processor of claim 25 wherein the portions do not overlap one another.

28. The data processor of claim 25 wherein all of the bits within each portion are adjacent to one another in the specified data.

29. The data processor of claim 25 wherein the portions are not all equally sized.

30. The data processor of claim 25 wherein the data processor comprises an instruction pipeline that generates at least two of the preliminary CRC codes at least partially concurrently with one another.

31. An information system comprising at least one data processor that generates a plurality of preliminary CRC codes in response to portions of specified data, each of the plurality of preliminary CRC codes being generated in response to a respective one of the portions, each one of the portions comprising bits adjacent to one another in the specified data, at least one of the plurality of preliminary CRC codes being generated at least partially concurrently with at least one other of the plurality of preliminary CRC codes, wherein the specified data comprises N bits including an LSB bit 0 and an MSB bit N−1, a jth portion has an LSB that is a bit startj of the specified data, the bit startj being positioned between the LSB and the MSB of the specified data, the data processor generates data indicative of a CRC code for a polynomial $x^{startj}$, and the data processor synthesizing a CRC code for the specified data in response to the plurality of preliminary CRC codes.

32. The information system of claim 31 wherein the data processor generates the portions by partitioning the specified data.

33. The information system of claim 31 wherein the portions do not overlap one another.

34. The information system of claim 31 wherein all of the bits within each portion are adjacent to one another in the specified data.

35. The information system of claim 31 wherein the portions are not all equally sized.

36. The information system of claim 31 wherein the data processor comprises an instruction pipeline that generates at least two of the preliminary CRC codes at least partially concurrently with one another.

37. A product comprising:
a computer readable media; and
information stored on the computer readable media to cause a computer to carry out a method for generating a CRC code for specified data, wherein the specified data comprises N bits including an LSB bit 0 and an MSB bit N−1, the method comprising
generating a plurality of preliminary CRC codes in response to portions of the specified data, each of the plurality of preliminary CRC codes being generated in response to a respective one of the portions, each one of the portions comprising bits adjacent to one another in the specified data, at least one of the plurality of preliminary CRC codes being generated at least partially concurrently with at least one other of the plurality of preliminary CRC codes, wherein a jth portion has an LSB that is a bit startj of the specified data, the bit startj being positioned between the LSB and the MSB of the specified data, and generating the preliminary CRC code associated with the jth portion comprises generating data indicative of a CRC code for a polynomial $x^{startj}$, and
synthesizing the CRC code for the specified data in response to the plurality of preliminary CRC codes.

38. The product of claim 37 wherein the method further comprises generating the portions by partitioning the specified data.

39. The product of claim 37 wherein the portions do not overlap one another.

40. The product of claim 37 wherein all of the bits within each portion are adjacent to one another in the specified data.

41. The product of claim 37 wherein the portions are not all equally sized.

42. The product of claim 37 wherein generating a plurality of preliminary CRC codes further comprises using an instruction pipeline that generates at least two of the preliminary CRC codes at least partially concurrently with one another.

43. A communication signal comprising:
information to cause a computer to carry out a method for generating a CRC code for specified data, wherein the specified data comprises N bits including an LSB bit 0 and an MSB bit N−1, the method comprising
generating a plurality of preliminary CRC codes in response to portions of the specified data, each of the plurality of preliminary CRC codes being generated in response to a respective one of the portions, each one of the portions comprising bits adjacent to one another in the specified data, at least one of the plurality of preliminary CRC codes being generated at least partially concurrently with at least one other of the plurality of preliminary CRC codes, wherein a jth portion has an LSB that is a bit startj of the specified data, the bit startj being positioned between the LSB and the MSB of the specified data, and generating the preliminary CRC code associated with the jth portion comprises generating data indicative of a CRC code for a polynomial $x^{startj}$, and
synthesizing the CRC code for the specified data in response to the plurality of preliminary CRC codes.

44. The communication signal of claim 43 wherein the method further comprises generating the portions by partitioning the specified data.

45. The communication signal of claim 43 wherein the portions do not overlap one another.

46. The communication signal of claim 43 wherein all of the bits within each portion are adjacent to one another in the specified data.

47. The communication signal of claim 43 wherein the portions are not all equally sized.

48. The communication signal of claim 43 wherein generating a plurality of preliminary CRC codes further comprises using an instruction pipeline that generates at least two of the preliminary CRC codes at least partially concurrently with one another.

49. A method implemented by a data processor for providing a remainder-based code for specified data, the specified data comprises N bits including an LSB bit 0 and an MSB bit N−1, the method comprising:
generating a plurality of preliminary remainder-based codes in response to portions of the specified data, each of the plurality of preliminary remainder-based codes being generated in response to a respective one of the portions, each one of the portions comprising bits adjacent to one another in the specified data, at least one of the plurality of preliminary remainder-based codes being generated at least partially concurrently with at least one other of the plurality of preliminary remainder-based codes, wherein a jth portion has an LSB that is a bit startj of the specified data, the bit startj being positioned between the LSB and the MSB of the specified data, and generating the preliminary remainder-based code associated with the jth portion comprises generating data indicative of a remainder-based code for a polynomial $x^{startj}$; and
synthesizing the remainder-based code for the specified data, in response to the plurality of preliminary remainder-based codes.

50. The method of claim 49 further comprising generating the portions by partitioning the specified data.

51. The method of claim 49 wherein all of the bits within each portion are adjacent to one another in the specified data.

52. The method of claim 49 wherein the portions are not all equally sized.

53. The method of claim 49 wherein the portions do not overlap one another.

54. The method of claim 49 wherein generating a plurality of preliminary remainder-based codes further comprises using an instruction pipeline that generates at least two of the preliminary remainder-based codes at least partially concurrently with one another.

55. A data processor for providing a remainder-based code for specified data, wherein the specified data comprises N bits including an LSB bit 0 and an MSB bit N−1, the data processor, comprising:

means for generating a plurality of preliminary remainder-bused codes in response to portions of the specified data, where each portion comprises bits adjacent to one another in the specified data, including means for generating each of the plurality of preliminary remainder-based codes in response to a respective one of the portions and means for generating at least one of the plurality of preliminary remainder-based codes at least partially concurrently with at least one other of the plurality of preliminary remainder-based codes, wherein a jth portion has an LSB that is a bit startj of the specified data, the bit startj being positioned between the LSB and the MSB of the specified data, and the means for generating each of the plurality of preliminary remainder-based codes includes means for generating data indicative of a remainder-based code for a polynomial $x^{startj}$; and means for synthesizing a remainder-based code for the specified data in response to the plurality of preliminary remainder-based codes.

56. The data processor of claim 55 further comprising means for generating the portions in response to the specified data.

57. The data processor of claim 56 wherein the means for generating the portions comprises means for generating the portions such that the portions do not overlap one another.

58. The data processor of claim 56 wherein the means for generating the portions comprises means for generating the portions such that all of the bits within each portion are adjacent to one another in the specified data.

59. The data processor of claim 56 wherein the means for generating the portions comprises means for generating the portions such that the portions are not all equally sized.

60. The data processor of claim 55 wherein the means for generating at least one of the plurality of preliminary remainder-based codes at least partially concurrently with at least one other of the plurality of preliminary remainder-based codes comprises an instruction pipeline that generates at least two of the preliminary remainder-based codes at least partially concurrently with one another.

61. A data processor that generates a plurality of preliminary remainder-based codes in response to portions of specified data, each of the plurality of preliminary remainder-based codes being generated in response to a respective one of the portions, each one of the portions comprising bits adjacent to one another in the specified data, at least one of the plurality of preliminary remainder-based codes being generated at least partially concurrently with at least one other of the plurality of preliminary remainder-based codes, wherein the specified data comprises N bits including an LSB bit 0 and an MSB bit N–1, a jth portion has an LSB that is a bit startj of the specified data, the bit startj being positioned between the LSB and the MSB of the specified data, the data processor generates data indicative of a remainder-based code for a polynomial $x^{startj}$, and the data processor synthesizing a remainder-based code for the specified data in response to the plurality of preliminary remainder-based codes.

62. The data processor of claim 61 wherein the data processor generates the portions by partitioning the specified data.

63. The data processor of claim 61 wherein the portions do not overlap one another.

64. The data processor of claim 61 wherein the all of the bits within each portion are adjacent to one another in the specified data.

65. The data processor of claim 61 wherein the portions are not all equally sized.

66. The data processor of claim 61 wherein the data processor comprises an instruction pipeline that generates at least two of the preliminary remainder-based codes at least partially concurrently with one another.

67. An information system comprising at least one data processor that generates a plurality of preliminary remainder-based codes in response to portions of specified data, each of the plurality of preliminary remainder-based codes being generated in response to. a respective one of the portions, each one of the portions comprising bits adjacent to one another in the specified data, at least one of the plurality of preliminary remainder-based codes being generated at least partially concurrently with at least one other of the plurality of preliminary remainder-based codes, wherein the specified data comprises N bits including an LSB bit 0 and an MSB bit N–1, a jth portion has an LSB that is a bit startj of the specified data, the bit startj being positioned between the LSB and the MSB of the specified data, the data processor generates data indicative of a remainder-based code for a polynomial $x^{startj}$, and the data processor synthesizing a remainder-based code for the specified data in response to the plurality of preliminary remainder-based codes.

68. The information system of claim 67 wherein the data processor generates the portions by partitioning the specified data.

69. The information system of claim 67 wherein the portions do not overlap one another.

70. The information system of claim 67 wherein all of the bits within each portion are adjacent to one another in the specified data.

71. The information system of claim 67 wherein the portions are not all equally sized.

72. The information system of claim 67 wherein the data processor comprises an instruction pipeline that generates at least two of the preliminary remainder-based codes at least partially concurrently with one another.

73. A product comprising:

a computer readable media; and information stored on the computer readable media to cause a computer to carry out a method for generating a remainder-based code for specified data, wherein the specified data comprises N bits including an LSB bit 0 and an MSB bit N–1, the method comprising generating a plurality of preliminary remainder-based codes in response to portions of the specified data, each of the plurality of preliminary remainder-based codes being generated in response to a respective one of the portions, each one of the portions comprising bits adjacent to one another in the specified data, at least one of the plurality of preliminary remainder-based codes being generated at least partially concurrently with at least one other of the plurality of preliminary remainder-based codes, wherein a jth portion has an LSB that is a bit startj of the specified data, the bit startj being positioned between the LSB and the MSB of the specified data, and generating the preliminary remainder-based code associated with the jth portion comprises generating data indicative of a remainder-based code for a polynomial $x^{startj}$, and synthesizing the remainder-based code for the specified data in response to the plurality of preliminary remainder-based codes.

74. The product of claim 73 wherein the method further comprises generating the portions by partitioning the specified data.

75. The product of claim 73 wherein the portions do not overlap one another.

76. The product of claim 73 wherein all of the bits within each portion are adjacent to one another in the specified data.

77. The product of claim 73 wherein the portions are not all equally sized.

78. The product of claim 73 wherein generating a plurality of preliminary remainder-based codes further comprises using an instruction pipeline that generates at least two preliminary remainder-based codes at least partially concurrently with one another.

79. A communication signal comprising:
information to cause a computer to carry out a method for generating a remainder-based code for specific data, wherein the specific data comprises N bits including an LSB bit 0 and an MSB bit N−1, the method comprising
generating a plurality of preliminary remainder-based codes in response to portions of the specified data, each of the plurality of preliminary remainder-based codes being generated in response to a respective one of the portions, each one of the portions comprising bits adjacent to one another in the specified data, at least one of the plurality of preliminary remainder-based codes being generated at least partially concurrently with at least one other of the plurality of preliminary remainder-based codes, wherein a jth portion has an LSB and the MSB of bit startj of the specified data, the bit startj being positioned between the LSB and the MSB of the specified data, and
generating the preliminary remainder-based code associated with the jth portion comprises generating data indicative of a remainder-based code for a polynomial $x^{startj}$, and
synthesizing the remainder-based code for the specified data in response to the plurality of preliminary remainder-based codes.

80. The communication signal of claim 79 wherein the method further comprises generating the portions by partitioning the specified data.

81. The communication signal of claim 79 wherein the portions do not overlap one another.

82. The communication signal of claim 79 wherein all of the bits within each portion are adjacent to one another in the specified data.

83. The communication signal of claim 79 wherein the portions are not all equally sized.

84. The product of claim 79 wherein generating a plurality of preliminary remainder-based codes further comprises using an instruction pipeline that generates at least two of the preliminary remainder-based codes at least partially concurrently with one another.

* * * * *

UNITED STATES PATENT AND TRADEMARK OFFICE
CERTIFICATE OF CORRECTION

PATENT NO. : 6,912,683 B2
DATED : June 28, 2005
INVENTOR(S) : Rifaat et al.

It is certified that error appears in the above-identified patent and that said Letters Patent is hereby corrected as shown below:

Column 23,
Line 33, after "in any of claims 1, 4 or 5" add -- wherein --.

Column 24,
Lines 17-18, change "wherein the means generating the portions" to -- wherein the means for generating to portions --.

Column 28,
Line 7, change "codes being generated in response to. a respective" to -- codes being generated in response to a respective --.
Line 59, change "data in response to the" to -- data, in response to the --.

Column 29,
Lines 5-6, change "that generates at least two preliminary" to -- that generates at least two of the preliminary --.
Lines 10 and 11, change "specific" to -- specified --.
Line 23, change "has and LSB and the MSB of bit startj" to -- has an LSB that is a bit startj --.

Signed and Sealed this

Thirty-first Day of January, 2006

JON W. DUDAS
*Director of the United States Patent and Trademark Office*